(12) United States Patent
Yamamoto et al.

(10) Patent No.: US 10,141,325 B2
(45) Date of Patent: Nov. 27, 2018

(54) METHOD OF MANUFACTURING SEMICONDUCTOR DEVICE

(71) Applicant: RENESAS ELECTRONICS CORPORATION, Tokyo (JP)

(72) Inventors: Yuki Yamamoto, Tokyo (JP); Tomohiro Yamashita, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/457,685

(22) Filed: Mar. 13, 2017

(65) Prior Publication Data
US 2017/0186764 A1 Jun. 29, 2017

Related U.S. Application Data

(63) Continuation of application No. 15/239,193, filed on Aug. 17, 2016, now Pat. No. 9,876,024.

(30) Foreign Application Priority Data

Aug. 20, 2015 (JP) ................. 2015-163136

(51) Int. Cl.
*H01L 21/265* (2006.01)
*H01L 27/11573* (2017.01)
(Continued)

(52) U.S. Cl.
CPC .. *H01L 27/11573* (2013.01); *H01L 21/26513* (2013.01); *H01L 21/28282* (2013.01);
(Continued)

(58) Field of Classification Search
CPC ......... H01L 27/11573; H01L 21/28282; H01L 21/26513
See application file for complete search history.

(56) References Cited

U.S. PATENT DOCUMENTS 6,400,252 B1 * 6/2002 Smith ..................... H01L 28/20
257/E21.004
2004/0124477 A1 7/2004 Minami et al.
(Continued)

FOREIGN PATENT DOCUMENTS

| JP | H11-297848 A | 10/1999 |
|---|---|---|
| JP | 2007-281091 A | 10/2007 |
| WO | 2010/076824 A1 | 7/2010 |

OTHER PUBLICATIONS

Non-Final Office Action issued in related U.S. Appl. No. 15/239,193, dated May 18, 2017.
(Continued)

*Primary Examiner* — Bradley K Smith
(74) *Attorney, Agent, or Firm* — McDermott Will & Emery LLP

(57) ABSTRACT

A performance of a semiconductor device is improved. A film, which is made of silicon, is formed in a resistance element formation region on a semiconductor substrate, and an impurity, which is at least one type of elements selected from a group including a group 14 element and a group 18 element, is ion-implanted into the film, and a film portion which is formed of the film of a portion into which the impurity is ion-implanted is formed. Next, an insulating film with a charge storage portion therein is formed in a memory formation region on the semiconductor substrate, and a conductive film is formed on the insulating film.

12 Claims, 26 Drawing Sheets

(51) Int. Cl.
*H01L 49/02* (2006.01)
*H01L 29/792* (2006.01)
*H01L 21/28* (2006.01)
*H01L 27/1157* (2017.01)
*H01L 27/06* (2006.01)
*H01L 27/11575* (2017.01)
*H01L 27/088* (2006.01)
*H01L 27/092* (2006.01)
*H01L 29/423* (2006.01)
*H01L 29/66* (2006.01)
*H01L 29/78* (2006.01)

(52) U.S. Cl.
CPC ...... *H01L 27/0629* (2013.01); *H01L 27/1157* (2013.01); *H01L 27/11575* (2013.01); *H01L 28/20* (2013.01); *H01L 29/792* (2013.01); *H01L 27/088* (2013.01); *H01L 27/0922* (2013.01); *H01L 29/42368* (2013.01); *H01L 29/66659* (2013.01); *H01L 29/7835* (2013.01)

(56) References Cited

U.S. PATENT DOCUMENTS

| | | |
|---|---|---|
| 2006/0208338 A1 | 9/2006 | Lee et al. |
| 2006/0261398 A1 | 11/2006 | Lee |
| 2007/0228446 A1 | 10/2007 | Toba et al. |
| 2013/0119480 A1 | 5/2013 | Wong et al. |
| 2013/0203230 A1* | 8/2013 | Chen ................. H01L 29/66477 438/287 |
| 2014/0239377 A1 | 8/2014 | Nishida et al. |
| 2016/0336337 A1 | 11/2016 | Lin |
| 2017/0053931 A1* | 2/2017 | Yamamoto ........ H01L 27/11573 |

OTHER PUBLICATIONS

Extended European Search Report issued in Application No. 16182633.4 dated Apr. 13, 2017.

* cited by examiner

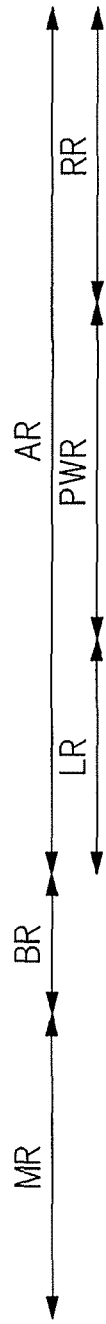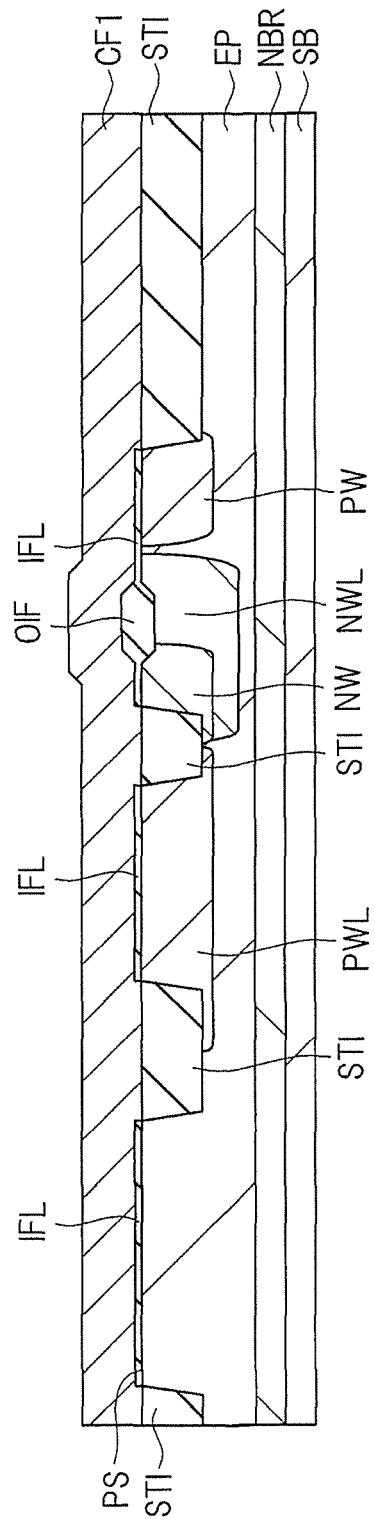
FIG. 9

METHOD OF MANUFACTURING SEMICONDUCTOR DEVICE

CROSS-REFERENCE TO RELATED APPLICATION

The present application is a continuation of U.S. patent application Ser. No. 15/239,193 filed Aug. 17, 2016, which is based upon and claims the benefit of priority from Japanese Patent Application No. 2015-163136 filed on Aug. 20, 2015, the content of which is hereby incorporated by reference into this application.

TECHNICAL FIELD OF THE INVENTION

The present invention relates to a technique of manufacturing a semiconductor device, and relates to effectively applied to, for example, a technique of manufacturing a semiconductor device on which a non-volatile memory is mixedly mounted as an add-on circuit added to a main circuit including a field-effect transistor.

BACKGROUND OF THE INVENTION

In a semiconductor device which has a main circuit including a metal insulator semiconductor field effect transistor (MISFET) as a field-effect transistor, an addition circuit (add-on circuit) which is added to a main circuit is formed so as to be separate from the main circuit to achieve a main function of the semiconductor device in some cases. For example, as an example of the addition circuit, a memory that stores trimming information or others can be exemplified.

As such a memory that stores the trimming information, a non-volatile memory (NV memory) with a floating gate structure, which is suitable to be mixedly mounted with the field-effect transistor included in the main circuit, has been used. In addition, as a non-volatile memory whose memory cell size can be reduced, usage of a non-volatile memory having a metal oxide nitride oxide semiconductor (MONOS) structure has been studied.

Japanese Patent Application Laid-Open Publication No. 2007-281091 (Patent Document 1) discloses a technique of forming a gate electrode and a resistor body by depositing a conductor film made of, for example, polycrystalline silicon on the main surface of the semiconductor substrate, and then, etching the conductor film in a semiconductor device provided with a plurality of non-volatile memories on a main surface of a semiconductor substrate.

Japanese Patent Application Laid-Open Publication No. H11-297848 (Patent Document 2) discloses a technique of forming a polycrystalline gate electrode layer on the gate insulating film while changing grain sizes depending on the type of the transistor by collectively forming gate insulating films of a plurality of types of transistors on a surface of a semiconductor substrate by performing a deposition process once in a method of manufacturing a semiconductor device.

SUMMARY OF THE INVENTION

When such a non-volatile memory as the add-on circuit is formed in a memory formation region, a well and a gate electrode such as a power transistor are formed in a main circuit formation region, and then, a gate electrode of the non-volatile memory having the MONOS structure is formed in the memory formation region. Accordingly, it is possible to suppress excessive application of a thermal load to the non-volatile memory at the time of forming the well or the gate electrode in the main circuit formation region.

Meanwhile, when the well and the gate electrode such as the power transistor are formed in the main circuit formation region, a polycrystalline silicon film for a resistor body of a resistance element is formed in some cases. In such a case, after that, heat treatment is performed in the memory formation region at the time of forming the non-volatile memory having the MONOS structure, so that growth of crystal grains of the polycrystalline silicon film included in the resistor body of the resistance element is promoted. And, when the growth of the crystal grains is promoted, the variation in the resistance difference among the plurality of the resistance elements, that is, deterioration of a so-called mismatch characteristic of resistance cannot be prevented or suppressed in each set of the plurality of resistance elements connected in parallel, and therefore, a performance of the semiconductor device decreases.

Other objects and novel characteristics will be apparent from the description of the specification and appended drawings.

According to an embodiment, in a method of manufacturing the semiconductor device, a film made of silicon is formed in a resistance element formation region on a semiconductor substrate, and an impurity of at least one type of elements selected from a group including a Group 14 Element and a Group 18 Element is ion-implanted into the film, so that a film portion into which the impurity is ion-implanted is formed. Next, a charge storage portion is provided inside a memory formation region on the semiconductor substrate, an insulating film for a gate insulating film of a MONOS transistor is formed, and a conductive film for a gate electrode of the MONOS transistor is formed on the insulating film.

According to an embodiment, the performance of the semiconductor device can be improved.

BRIEF DESCRIPTIONS OF THE DRAWINGS

FIG. 9 is a cross-sectional view of a principal part in the middle of the process of manufacturing the semiconductor device according to the embodiment;

DESCRIPTIONS OF THE PREFERRED EMBODIMENTS

Figure 1:
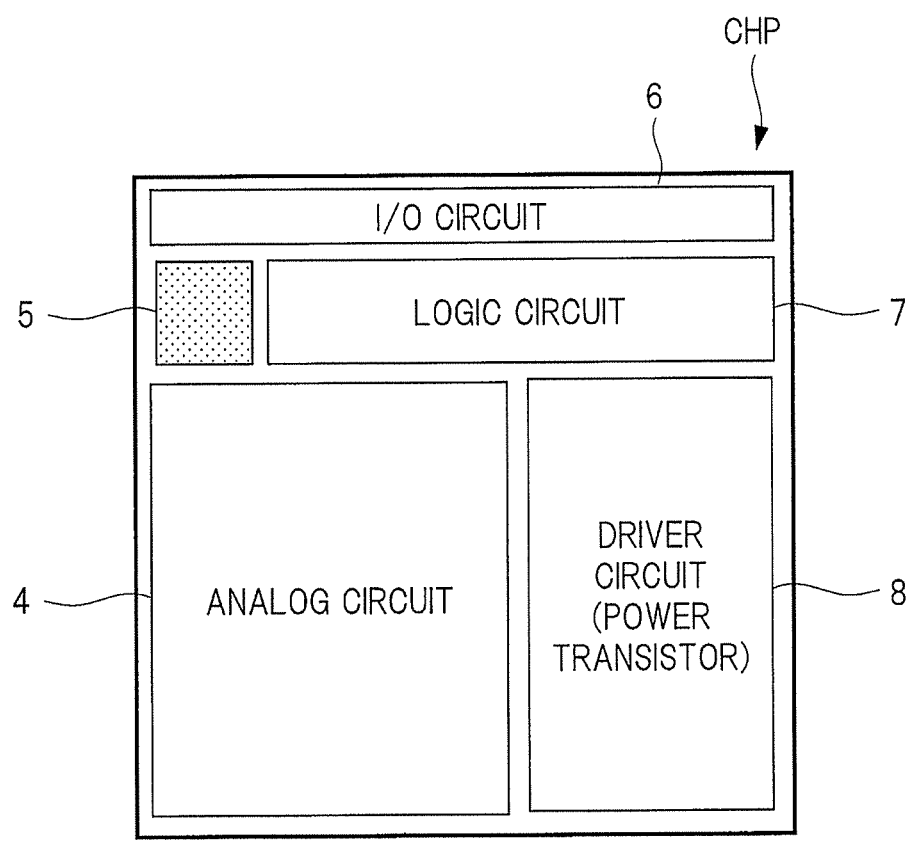
FIG. 1 is a diagram illustrating a layout configuration example of a semiconductor chip according to an embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and others), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and others are mentioned, the substantially approximate and similar shapes and others are included therein unless otherwise stated or except the case where it is conceivable that they are apparently excluded in principle. The same goes for the numerical value and the range described above.

Also, the same components are denoted by the same reference symbols in principle throughout all the drawings for describing the embodiments, and the repetitive description thereof is omitted. Note that hatching is used even in a plan view so as to make the drawings easy to see

Embodiment

A technical idea according to the present embodiment is a technical idea that relates to a semiconductor device including, on the same semiconductor chip, a main circuit for achieving a main function of a semiconductor chip and an additional circuit called an add-on circuit which is added to the main circuit, in which the add-on circuit is configured of a rewritable MONOS-type non-volatile memory.

For example, when a system on chip (SOC) is exemplified, the main circuit is as follows. That is, as the main circuit, a memory circuit such as a dynamic random access memory (DRAM) or a static random access memory (SRAM), a logic circuit such as a central processing unit (CPU) or a micro processing unit (MPU), a mixing circuit of both the memory circuit and the logic circuit, or others, can be exemplified.

Meanwhile, as the add-on circuit, a memory circuit that stores information of a relatively small volume relating to the main circuit, a fuse to be used for relief of a circuit, or others, can be exemplified. For example, as the information of relatively small volume, arrangement address information of an element to be used at the time of trimming inside the semiconductor chip, arrangement address information of a memory cell to be used at the time of relief of the memory circuit, a product serial number of the semiconductor device, or others, can be exemplified.

<Layout Configuration Example of Semiconductor Chip>

The following embodiment will be explained while exemplifying a semiconductor chip in which a system for achieving a main function is formed. The semiconductor chip according to the present embodiment includes a low-breakdown-voltage MISFET driven by a relatively low voltage, a power transistor for high power, which is a high-breakdown-voltage MISFET driven by a relatively high voltage in which high voltage driving is possible, a resistance element, and a rewritable non-volatile memory cell.

In the MISFET, the breakdown voltage means a p-n junction breakdown voltage generating at a boundary between a source region and a semiconductor substrate (well) which configures the MISFET or between a drain region and the semiconductor substrate (well), and means a dielectric breakdown voltage of agate insulating film. At this time, in the present embodiment, the power transistor, which is the high-breakdown-voltage MISFET having a relatively high breakdown voltage, and the low-breakdown-voltage MISFET having a relatively low breakdown voltage are formed in the semiconductor substrate.

FIG. 1 is a diagram illustrating a layout configuration example of the semiconductor chip according to the embodiment. In FIG. 1, a semiconductor chip CHP includes an analog circuit 4, a non-volatile memory 5, an input/output (I/O) circuit 6, a logic circuit 7, and a driver circuit 8.

The analog circuit 4 is a circuit that handles a signal of voltage or current that continuously temporally changes, that is, an analog signal, and is configured of, for example, an amplifier circuit, a converter circuit, a modulator circuit, an oscillator circuit, a power supply circuit or others. For such an analog circuit 4, a power transistor with a relatively high breakdown voltage among the elements formed in the semiconductor chip CHP is used.

In the present embodiment, the explanation will be made for an example in which a laterally diffused metal oxide semiconductor field effect transistor (LDMOSFET) is formed as the high-breakdown-voltage MISFET, that is, the power transistor. Thus, as described below with reference to FIG. 3, the semiconductor chip CHP in the present embodiment is the semiconductor chip CHP having a bipolar complementary double-diffused metal oxide semiconductor (BiC-DMOS) formed as the power transistor.

The non-volatile memory 5 is a type of a non-volatile memory in which both a write operation and an erase operation are electrically rewritable, and is also called an electrically-erasable programmable read-only memory. In the present embodiment, the non-volatile memory 5 is configured of a MONOS transistor. For example, for the write operation and the erase operation of the MONOS transistor, a Fowler-Nordheim (FN) tunneling phenomenon is used. Note that it is also possible to perform the write operation and the erase operation using a hot electron or a hot hole.

Since a high potential difference (about 12 V) is applied to the MONOS transistor during the write operation to the non-volatile memory 5 or others, a transistor having a relatively high breakdown voltage is required as the MONOS transistor.

The I/O circuit 6 is an input and output circuit, and is a circuit configured to output data from the inside of the semiconductor chip CHP to a device connected to the outside of the semiconductor chip CHP and input data from the device connected to the outside of the semiconductor chip CHP to the inside of the semiconductor chip CHP. This I/O circuit 6 is configured of a MISFET having a relatively high breakdown voltage.

The logic circuit 7 is configured of, for example, an n-channel low-breakdown-voltage MISFET and a p-channel low-breakdown-voltage MISFET.

The driver circuit 8 is configured of, for example, an n-channel power transistor and a p-channel power transistor.

Here, the main circuit is configured of the analog circuit 4, the logic circuit 7, and the driver circuit 8, and the add-on circuit is configured of the non-volatile memory 5. That is, in the semiconductor chip CHP according to the present embodiment, the main circuit for achieving the main function and the add-on circuit added to the main circuit are formed. Further, in the present embodiment, the MONOS transistor is applied to the add-on circuit.

In the present embodiment, the add-on circuit is configured of the electronic fuse to be used for voltage adjustment or others after completion of a wafer, and this electronic fuse is configured of the MONOS transistor which is the rewritable non-volatile memory, so that a multi time program (MTP) electronic fuse which can be adjusted several times in a wafer state or a package state is achieved.

In addition, for example, while a non-volatile memory (NV memory) having a floating gate structure, which is suitable to be mixedly mounted with a field-effect transistor included in the main circuit, is used as a memory to store the trimming information, the usage causes an increase in size of the memory cell. In regard to such a point, by application of the MONOS transistor instead of the non-volatile memory (NV memory) having the floating gate structure, an advantage of reducing the size of the memory cell can be obtained. Further, a FN tunneling current is used for the rewrite of data in the MONOS transistor, and thus, the data can be rewritten by a low current, so that power consumption can be reduced.

The semiconductor device of the present embodiment is the semiconductor device including the main circuit and the add-on circuit, and has a characteristic in a technique of manufacturing the semiconductor device for achieving the semiconductor device in which the MONOS transistor is applied as the add-on circuit. That is, the semiconductor device of the present embodiment has a characteristic in terms of the manufacturing technique for mixedly mounting the MONOS transistor which is the component of the addition circuit with the low-breakdown-voltage MISFET and the power transistor which are the components of the main circuit.

<Circuit Block Configuration of Non-Volatile Memory>

Figure 2:
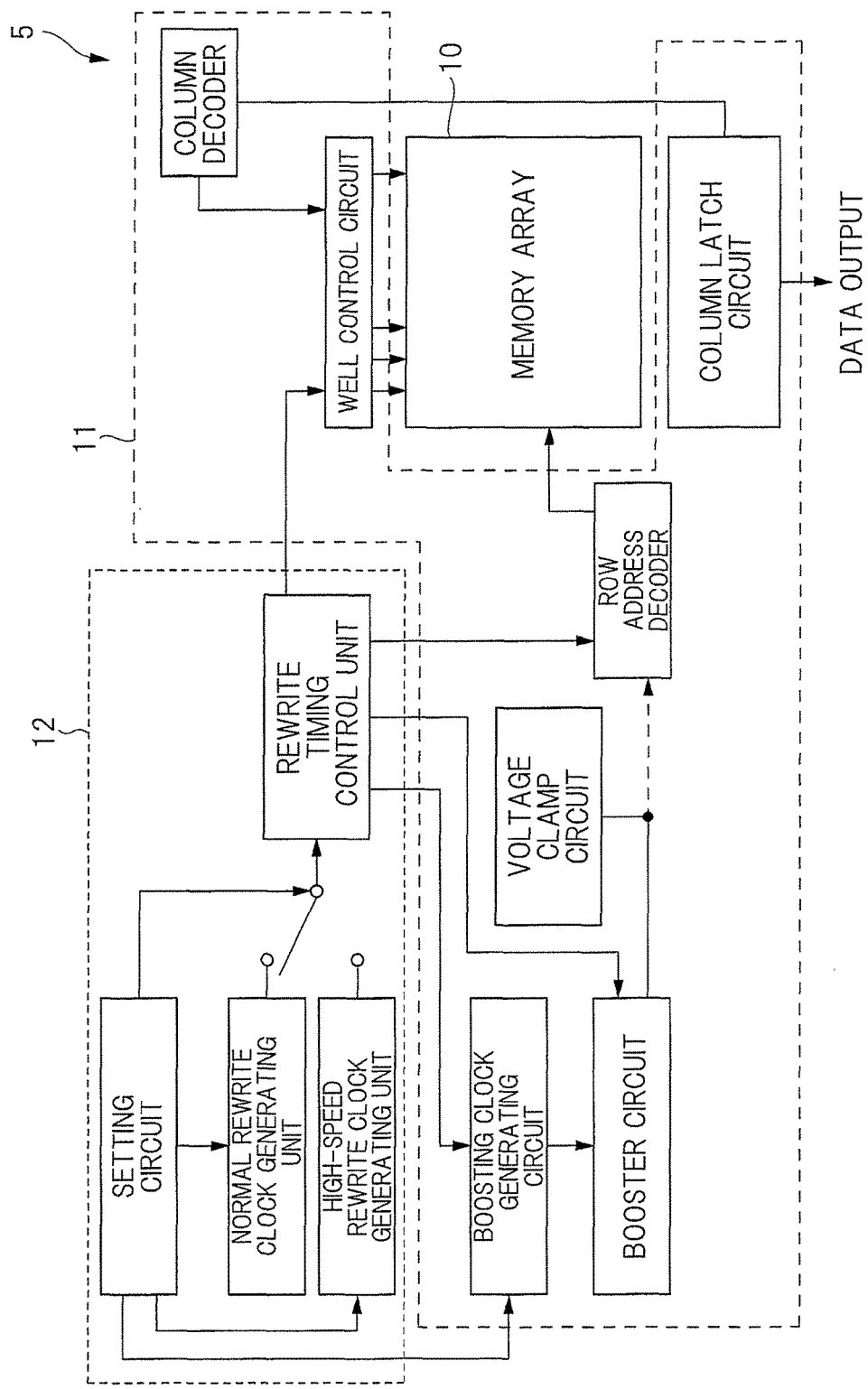
FIG. 2 is a diagram illustrating an example of a circuit block configuration of a non-volatile memory.

Next, FIG. 2 is a diagram illustrating an example of a circuit block configuration of the non-volatile memory. In FIG. 2, the non-volatile memory 5 includes a memory array 10, a direct peripheral circuit portion 11, and an indirect peripheral circuit portion 12.

The memory array 10 corresponds to a storage unit of the non-volatile memory 5, and includes a plurality of memory cells being vertically and horizontally arranged in a two-dimensional shape (array form). The memory cell is a circuit configured to store unit information for one bit, and is configured of the MONOS transistor serving as a storage unit.

The direct peripheral circuit portion 11 is a circuit configured to drive the memory array 10, that is, a drive circuit, and includes, for example, a booster circuit to generate multiple times of voltage from a power-supply voltage, a boosting clock generating circuit, a voltage clamp circuit, a column decoder and a row address decoder to select a row or a column, a column latch circuit, a well control circuit, and others. The MISFET configuring the direct peripheral circuit portion 11 is formed of a MISFET which requires a relatively high breakdown voltage among the elements formed in the semiconductor chip CHP.

In addition, the indirect peripheral circuit portion 12 is a rewrite control circuit of the memory array, and includes a setting circuit, a normal rewrite clock generating unit, a high-speed rewrite clock generating unit, a rewrite timing control unit, and others. The MISFET configuring the indirect peripheral circuit portion 12 is formed of a low-breakdown-voltage MISFET which is driven with a relatively low voltage and is capable of a high-speed operation among the elements formed in the semiconductor chip CHP.

<Structure of Semiconductor Device>

Figure 3:
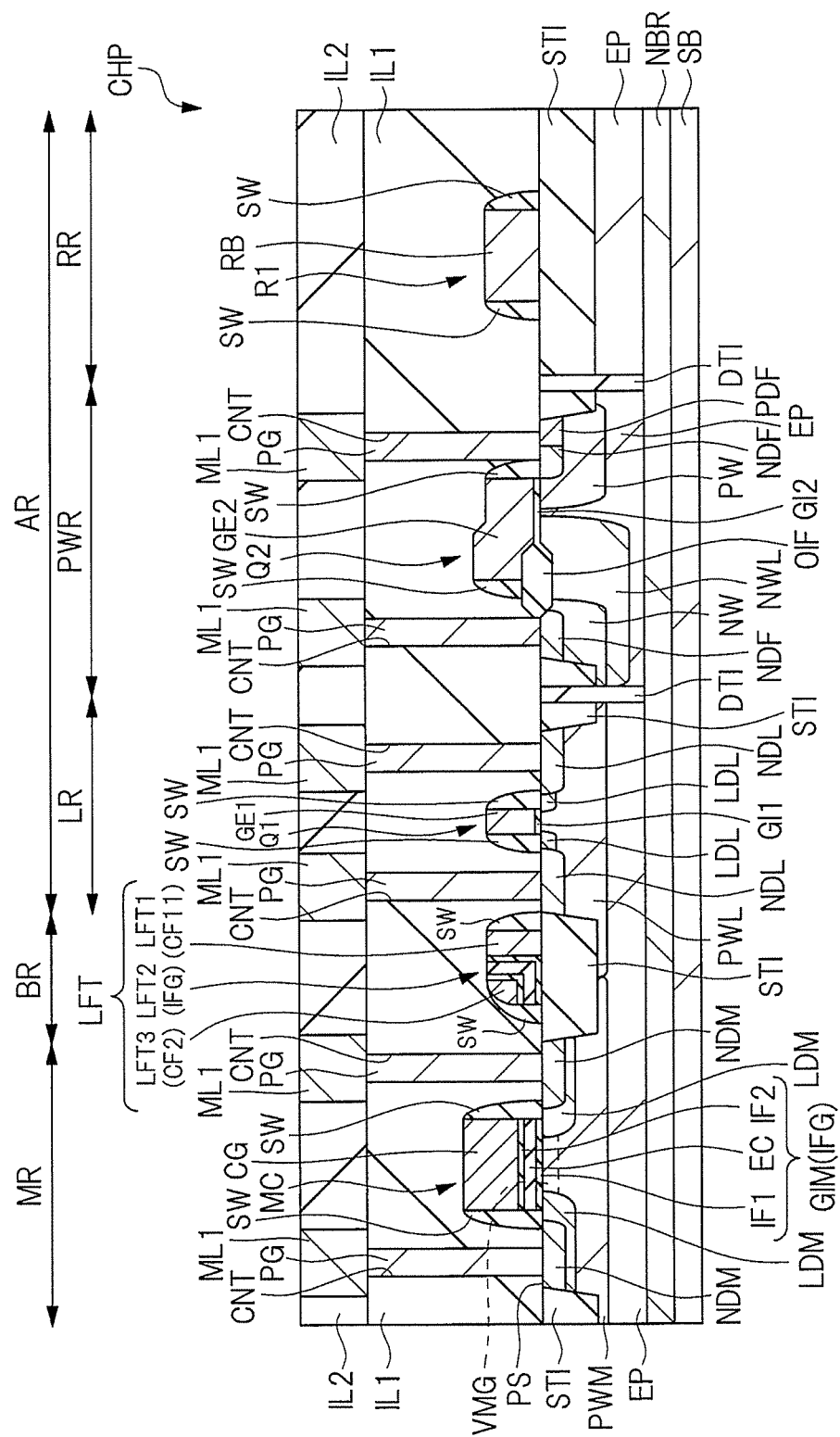
FIG. 3 is a cross-sectional view of a principal part of the semiconductor device according to the embodiment.

Next, a structure of the semiconductor chip CHP serving as the semiconductor device of the embodiment will be described with reference to the drawings. FIG. 3 is a cross-sectional view of a principal part of the semiconductor device of the embodiment.

As illustrated in FIG. 3, the semiconductor chip CHP serving as the semiconductor device of the embodiment has a memory formation region MR, a main circuit formation region AR, and a boundary region BR which is sandwiched between the memory formation region MR and the main circuit formation region AR. In addition, the main circuit formation region AR has a low-breakdown-voltage MISFET formation region LR, a power transistor formation region PWR, and a resistance element formation region RR.

The memory cell of the non-volatile memory 5 illustrated in FIG. 1 is formed in the memory formation region MR, and this memory cell is formed of a MONOS transistor MC.

A low-breakdown-voltage MISFET Q1, which requires a large current driving force in order to enable the high-speed operation, is formed in the low-breakdown-voltage MISFET formation region LR. As a region in which such a low-breakdown-voltage MISFET Q1 is formed, for example, a formation region of the logic circuit 7 or others is considered. The low-breakdown-voltage MISFET Q1 operates with a power supply voltage of, for example, about 1.5 V. Note that the explanation will be made below while exemplifying a case in which the n-channel low-breakdown-voltage MISFET Q1 is formed in the low-breakdown-voltage MISFET formation region LR. However, a p-channel low-breakdown-voltage MISFET may be formed in the low-breakdown-voltage MISFET formation region LR.

A power transistor Q2 is formed in the power transistor formation region PWR. As a region in which such a power transistor Q2 is formed, for example, a formation region of the driver circuit 8 or others is considered. Note that the explanation will be made below while exemplifying a case in which the n-channel power transistor Q2 is formed in the power transistor formation region PWR. However, a p-channel power transistor may be formed in the power transistor formation region PWR. In addition, in the example illustrated in FIG. 3, the LDMOSFET is formed as the power transistor Q2 as described above.

A resistance element R1 is formed in the resistance element formation region RR. As a region in which such a resistance element R1 is formed, for example, the formation region of the logic circuit 7 or the driver circuit 8 is considered.

As illustrated in FIG. 3, the semiconductor chip CHP includes a semiconductor substrate SB. The semiconductor substrate SB has the memory formation region MR, the low-breakdown-voltage MISFET formation region LR, the power transistor formation region PWR, and the resistance element formation region RR in a partial region of an upper surface PS serving as a main surface.

An n-type buried region NBR serving as an n-type semiconductor region is formed on the upper surface PS side, which is the main surface of the semiconductor substrate SB, in the memory formation region MR, the low-breakdown-voltage MISFET formation region LR, the power transistor formation region PWR, and the resistance element formation region RR. In addition, a p$^-$-type epitaxial layer EP serving as a p-type semiconductor region is formed on the n-type buried region NBR.

Here, the "p-type" means a conductivity type using a hole as a major charge carrier is. In addition, the "n-type" means a conductivity type using an electron as the major charge carrier which is opposite to the p-type.

Note that a silicon on insulator (SOI) substrate can be used as the semiconductor substrate SB. That is, not the n-type buried region NBR but a buried insulating layer may be formed on the semiconductor substrate SB, and not the p$^-$-type epitaxial layer EP but a silicon layer may be formed on the buried insulating layer.

An element isolation region STI to isolate the elements is formed on the upper surface PS as the main surface of the semiconductor substrate SB. In addition, active regions isolated by the element isolation region STI serve as the memory formation region MR, the low-breakdown-voltage MISFET formation region LR, and the power transistor formation region PWR, respectively. A deep trench isolation region DTI, which passes through the p$^-$-type epitaxial layer EP and reaches the n-type buried region NBR, is formed in the element isolation region STI partitioning the power transistor formation region PWR.

Meanwhile, in the resistance element formation region RR, the element isolation region STI is formed on the upper surface PS, which is the main surface of the semiconductor substrate SB, over the entire resistance element formation region RR.

In the memory formation region MR, a p-type well PWM is formed on the upper surface PS side of the semiconductor substrate SB. In addition, a p-type semiconductor region VMG is formed in an upper layer portion of the p-type well PWM, that is, a portion where a channel region is to be formed.

Meanwhile, a p-type well PWL is formed in the low-breakdown-voltage MISFET formation region LR on the upper surface PS side of the semiconductor substrate SB, and an n-type well NWL and a p-type well PW are formed to be spaced apart from each other in the power transistor formation region PWR on the upper surface PS side of the semiconductor substrate SB. In addition, an n-type well NW is formed to be enclosed by the n-type well NWL.

In addition, in the present embodiment, the explanation will be made while exemplifying a case in which an n-channel MISFET is formed in the low-breakdown-voltage MISFET formation region LR. However, a p-channel MISFET may be formed in the low-breakdown-voltage MISFET formation region LR. In addition, in the present embodiment, the explanation will be made while exemplifying a case in which the n-channel power transistor is formed in the power transistor formation region PWR. However, the p-channel power transistor may be formed in the power transistor formation region PWR.

Next, the MONOS transistor MC which is formed in the memory formation region MR will be explained. The MONOS transistor MC includes the p-type well PWM, a gate insulating film GIM, a gate electrode CG, a sidewall spacer SW, an n$^-$-type semiconductor region LDM, and an n$^+$-type semiconductor region NDM. That is, the non-volatile memory is formed of the gate electrode CG and the gate insulating film GIM. In addition, the gate insulating film GIM includes an insulating film IF1 made of, for example, silicon oxide, a charge storage film EC serving as an insulating film made of, for example, silicon nitride, and an insulating film IF2 made of, for example, silicon oxide, and is also referred to as an oxide-nitride-oxide (ONO) film.

The insulating film IF1 is formed on the p-type well PWM which is formed on the upper surface PS side of the semiconductor substrate SB, and the charge storage film EC is formed on the insulating film IF1. Further, the insulating film IF2 is formed on the charge storage film EC, and the gate electrode CG, made of a conductive film, is formed on the insulating film IF2. The gate electrode CG is made of, for example, polycrystalline silicon, that is, polysilicon.

Note that the conductive film in the specification of the present application means a film having a resistivity of, for example, equal to or smaller than about $10^{-3}$ Ωm.

The sidewall spacers SW, each of which is formed of an insulating film and serves as a sidewall portion, are formed on both side surfaces of the gate electrode CG in order to form a lightly doped drain (LDD) structure. The n⁻-type semiconductor region LDM is formed in the upper layer portion of the p-type well PWM in a portion positioned below the sidewall spacer SW, and the n⁺-type semiconductor region NDM is formed in the upper layer portion of the p-type well PWM in a portion positioned outside the n⁻-type semiconductor region LDM when seen in a plan view. The n⁺-type semiconductor region NDM is in contact with the n⁻-type semiconductor region LDM, and an impurity concentration of the n⁺-type semiconductor region NDM is higher than an impurity concentration of the n⁻-type semiconductor region LDM. In addition, the channel region is formed in the p-type well PWM in a portion positioned immediately below the insulating film IF1, that is, in an upper layer portion of the p-type semiconductor region VMG. Note that a silicide film may be formed on an upper surface of the gate electrode CG and an upper surface of the n⁺-type semiconductor region NDM in order to achieve the lower resistance although not illustrated.

The insulating film IF1 is made of, for example, a silicon oxide film. The insulating film IF1 functions as a tunnel insulating film when data is stored or erased by implanting an electron into the charge storage film EC from the semiconductor substrate SB via the insulating film IF1 or by releasing the electron stored in the charge storage film EC to the semiconductor substrate SB.

The charge storage film EC is an insulating film which is provided as a charge storage portion to store the charge contributing to the data storage, and is made of, for example, the silicon nitride. Therefore, the gate insulating film GIM includes the charge storage film EC as the charge storage portion therein.

Conventionally, a polycrystalline silicon film has been mainly used as the charge storage film EC. However, if there is a defect in any part of an oxide film surrounding the charge storage film EC when the polycrystalline silicon film is used as the charge storage film EC, all charge stored in the charge storage film EC is extracted due to an abnormal leakage since the charge storage film EC is the conductor.

Thus, the insulating film made of the silicon nitride film has been used as the charge storage film EC as described above. In this case, the charge contributing to the data storage is stored in a discrete trap level (trapping level) existing in the charge storage film EC. Accordingly, the charge is stored in the discrete trap level of the charge storage film EC even when a defect is generated in a part of the oxide film surrounding the charge storage film EC, and thus, the extraction of all charge from the charge storage film EC does not occur. Thus, the reliability in data retention can be improved.

Because of the above-described reason, the reliability in the data retention can be improved by using not only the insulating film made of the silicon nitride but also the film including the discrete trap level.

The insulating film IF2 is made of, for example, a silicon oxide film. The insulating film IF2 functions as the tunnel insulating film when the data is stored and erased by implanting an electron from the gate electrode CG into the charge storage film EC via the insulating film IF2 or by releasing the electron stored in the charge storage film EC to the gate electrode CG.

The sidewall spacer SW is formed to allow a source region and a drain region, which are semiconductor regions of the MONOS transistor MC, to have the LDD structure. That is, each of the source region and the drain region of the MONOS transistor MC is formed of the n⁻-type semiconductor region LDM and the n⁺-type semiconductor region NDM. At this time, when the source region in a portion below the gate electrode CG and the drain region in a portion below the gate electrode CG are formed to be the n⁻-type semiconductor region LDM, it is possible to suppress electric field concentration below an end portion of the gate electrode CG.

Next, the low-breakdown-voltage MISFET Q1 which is formed in the low-breakdown-voltage MISFET formation region LR will be explained. The low-breakdown-voltage MISFET Q1 includes the p-type well PWL, a gate insulating film GI1, a gate electrode GE1, the sidewall spacer SW, an n⁻-type semiconductor region LDL, and an n⁺-type semiconductor region NDL.

The gate insulating film GI1 is formed on the p-type well PWL which is formed on the upper surface PS side, which is the main surface of the semiconductor substrate SB, and the gate electrode GE1 is formed on the gate insulating film GI1. The gate insulating film GI1 is made of, for example, silicon oxide. The gate electrode GE1 is made of, for example, polycrystalline silicon, that is, polysilicon.

The sidewall spacers SW, which are made of, for example, insulating films and which serve as sidewall portions, are formed on both side surfaces of the gate electrode GE1. The n⁻-type semiconductor region LDL is formed in an upper layer portion of the p-type well PWL in a portion positioned below the sidewall spacer SW, and the n⁺-type semiconductor region NDL is formed in the upper layer portion of the p-type well PWL in a portion positioned outside the n⁻-type semiconductor region LDL when seen in a plan view. The n⁺-type semiconductor region NDL is in contact with the n⁻-type semiconductor region LDL, and an impurity concentration of the n⁺-type semiconductor region NDL is higher than an impurity concentration of the n⁻-type semiconductor region LDL. In addition, the channel region is formed in the upper layer portion of the p-type well PWL in a portion positioned immediately below the gate insulating film GI1. Note that a silicide film may be formed on an upper surface of the gate electrode GE1 and an upper surface of the n⁺-type semiconductor region NDL in order to achieve the lower resistance, although not illustrated.

Next, the power transistor Q2 which is formed in the power transistor formation region PWR will be explained. The power transistor Q2 includes the n-type well NWL, the p-type well PW, the n-type well NW, a gate insulating film GI2, a gate electrode GE2, the sidewall spacer SW, an n⁺-type semiconductor region NDF, and a p⁺-type semiconductor region PDF.

As described above, in the present embodiment, the LDMOSFET is formed as an example of the power transistor with the high breakdown voltage. Thus, in the present embodiment, the semiconductor chip CHP is the semiconductor chip CHP in which the BiC-DMOS is formed as the power transistor with the high breakdown voltage.

The n-type well NWL and the p-type well PW are formed to be spaced apart from each other in the semiconductor substrate SB, that is, on the upper surface PS side of the p⁻-type epitaxial layer EP, and the n-type well NW is formed to be included in the n-type well NWL.

The n⁺-type semiconductor region NDF (source region) is formed to be included in the n-type well NW. Meanwhile, the n⁺-type semiconductor region NDF (source region) and the p⁺-type semiconductor region PDF (body contact region) are formed to be included in the p-type well PW (body region), and the n⁺-type semiconductor region NDF and the p⁺-type semiconductor region PDF are formed to be adjacent to each other.

The n-type well NWL is formed at a position spaced apart from the p-type well PW when seen in a plan view. Therefore, the p-type well PW and the p⁻-type epitaxial layer EP are sandwiched between the n-type well NWL and the n⁺-type semiconductor region NDF included in the p-type well PW along the upper surface PS of the semiconductor substrate SB.

Further, the gate insulating film GI2 is formed on the upper surface PS of the semiconductor substrate SB, and the gate electrode GE2 is formed on the gate insulating film GI2. The gate insulating film GI2 is made of, for example, silicon oxide, and the gate electrode GE2 is made of, for example, polycrystalline silicon, that is, a polysilicon film. A portion of the gate electrode GE2 on the drain side is formed on a surface of the n-type well NWL to ride on an offset insulating film OIF which is included in the gate insulating film GI2. The sidewall spacer SW, which is made of, for example, an insulating film and which serves as a sidewall portion, is formed on both side surfaces of the gate electrode GE2.

A residual pattern LFT, which is a trace of the manufacturing process, is formed in the boundary region BR. Specifically, the residual pattern LFT according to the present embodiment includes a residual portion LFT1, a residual portion LFT2, and a residual portion LFT3. The residual portion LFT1 is a residual of a conductive film CF11 which is formed on the same layer as the gate electrodes GE1 and GE2. The residual portion LFT2 is a residual of an insulating film IFG formed of the insulating film IF1, the charge storage film EC, and the insulating film IF2. The residual portion LFT3 is a residual of a conductive film CF2 which is formed on the same layer as the gate electrode CG. At this time, the residual portion LFT3 is a sidewall portion which is formed on a side surface of the residual portion LFT1 in a sidewall form via the residual portion LFT2. Note that the sidewall spacer SW is formed also on a side surface of the residual pattern LFT.

Next, the resistance element R1 which is formed in the resistance element formation region RR will be explained. The resistance element R1 includes a resistor body RB and the sidewall spacer SW.

The resistor body RB is formed on the element isolation region STI which is formed on the upper surface PS side of the semiconductor substrate SB, that is, the upper surface PS side of the p⁻-type epitaxial layer EP. The resistor body RB is made of, for example, polycrystalline silicon, that is, polysilicon. The sidewall spacer SW, which is made of, for example, an insulating film and which serves as a sidewall portion, is formed on both side surfaces of the resistor body RB.

On the semiconductor substrate SB, an interlayer insulating film IL1 is formed to cover the MONOS transistor MC, the low-breakdown-voltage MISFET Q1, the power transistor Q2, and the resistance element R1. The interlayer insulating film IL1 is famed of, for example, an insulating film made of silicon oxide or a staked film formed of an insulating film made of silicon nitride and an insulating film made of silicon oxide. An upper surface of the interlayer insulating film IL1 is flattened.

Although not illustrated, note that an insulating film made of, for example, silicon nitride or others may be formed on the semiconductor substrate SB to cover the MONOS transistor MC, the low-breakdown-voltage MISFET Q1, the power transistor Q2, and then, the interlayer insulating film IL1 may be formed on the insulating film.

A contact hole CNT is formed in the interlayer insulating film IL1, and a plug PG made of a conductor film is buried in the contact hole CNT. The plug PG is formed of a thin barrier conductor film, which is formed on a bottom portion and a sidewall, that is, a side surface of the contact hole CNT, and a main conductor film formed on the barrier conductor film to be buried in the contact hole CNT. FIG. 3 integrally illustrates the barrier conductor film and the main conductor film, which configure the plug PG for simplification of the drawing. Note that the barrier conductor film configuring the plug PG, can be, for example, a titanium (Ti) film, a titanium nitride (TiN) film or a stacked film thereof, and the main conductor film configuring the plug PG can be, for example, a tungsten (W) film.

The plug PG is formed on each of the n⁺-type semiconductor regions NDM, NDL and NDF, and the p⁺-type semiconductor region PDF, and is also formed on each of the gate electrodes CG, GE1 and GE2, and the resistor body RB although not illustrated. Further, the plug PG is electrically connected with each of the n⁺-type semiconductor regions NDM, NDL and NDF, and the p⁺-type semiconductor region PDF, and is electrically connected also with the gate electrodes CG, GE1 and GE2, and the resistor body RB although not illustrated.

The interlayer insulating film IL2 is formed on the interlayer insulating film IL1 in which the plug PG is buried, and a first-layer wiring ML1 is formed in a wiring trench formed in the interlayer insulating film IL2 as a damascene wiring, which is a buried wiring containing, for example, copper (Cu) as a main conductive material. In addition, on the first-layer wiring ML1, an upper-layer wiring is also formed as a damascene wiring. However, illustration and description thereof will be omitted here. In addition, the first-layer wiring ML1 and the upper-layer wiring thereof are not limited to the damascene wiring, and can be formed by patterning a wiring conductive film, and can be formed as, for example, a tungsten (W) wiring, an aluminum (Al) wiring or others.

In the memory formation region MR in the present embodiment, as described later with reference to FIGS. 7 to 2, an impurity for suppression of the growth of crystal grains is implanted into a CF1 made of, for example, polycrystalline silicon in the resistance element formation region RR by using an ion implantation method before forming the insulating film IFG for the gate insulating film of the MONOS transistor MC.

In this manner, after that, even when the semiconductor substrate SB is subjected to heat treatment, for example, at high temperature of 1150° C. for about two hours after forming the insulating film IFG, the growth of the crystal grains in the film CF1 can be prevented or suppressed. Thus, in each set including the N (N is plural) resistance elements R1 connected in parallel, a variation in resistance difference among the N resistance elements R1 can be prevented or suppressed, and deterioration of a so-called resistance mismatch characteristic can be prevented or suppressed.

<Operation of Non-Volatile Memory>

The semiconductor device according to the present embodiment is configured as described above, and an operation of the memory cell (non-volatile memory cell) included in this semiconductor device will be explained below.

Figure 4:
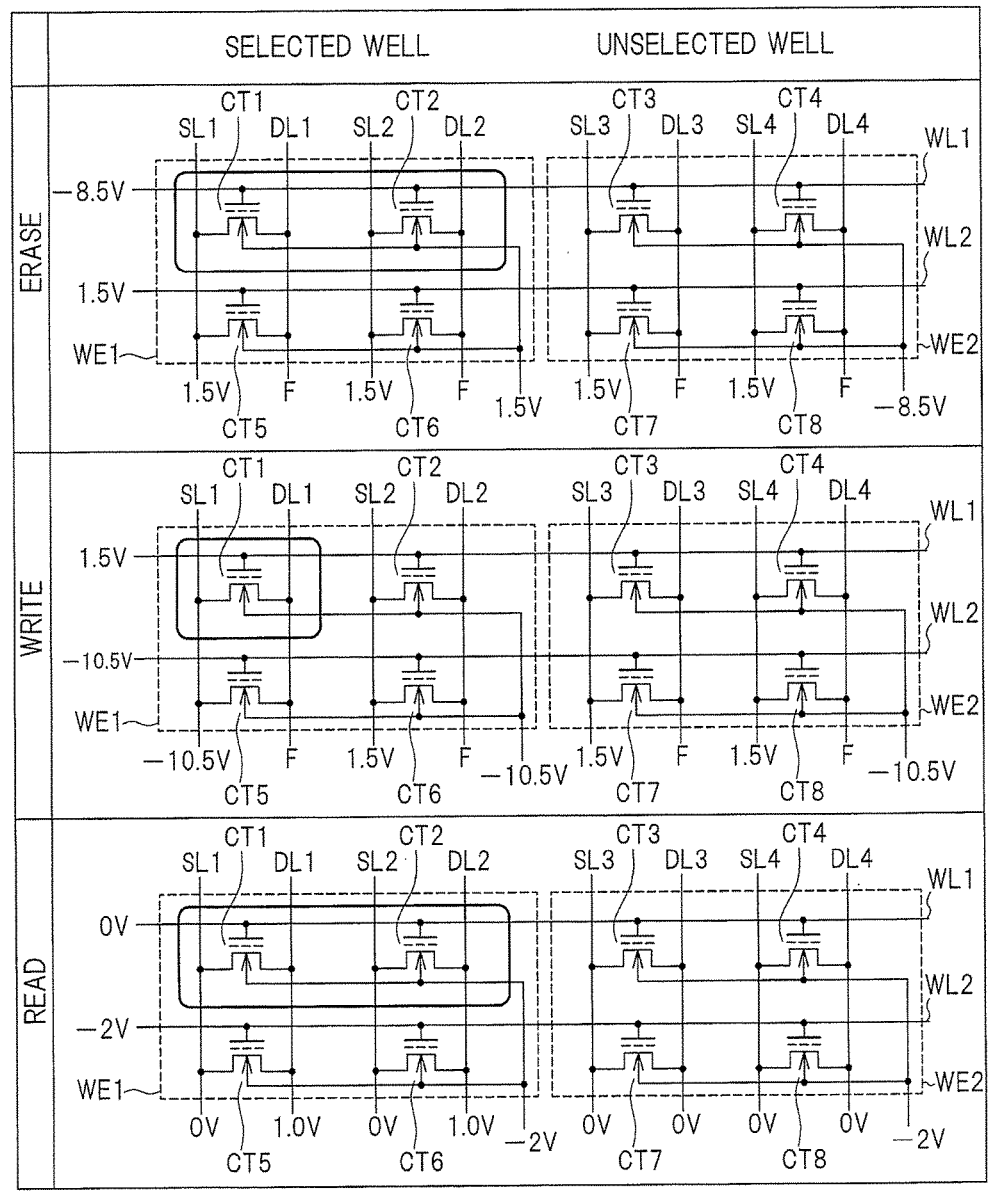
FIG. 4 is an explanatory diagram illustrating examples of a memory array structure and an operating condition of the non-volatile memory.

FIG. 4 is an explanatory diagram illustrating an example of a memory array structure of the non-volatile memory and an operating condition (one cell/one transistor). In FIG. 4, each of cell transistors CT1 to CT8 corresponds to the memory cell configured of the MONOS transistor MC illustrated in FIG. 3. Each gate electrode of the cell transistors CT1 to CT4 is connected to a word line WL1, and each gate electrode of the cell transistors CT5 to CT8 is connected to a word line WL2.

Each source region of the cell transistors CT1 and CT5 is connected to a source line SL1, and each source region of the cell transistors CT2 and CT6 is connected to a source line SL2. In addition, each source region of the cell transistors CT3 and CT7 is connected to a source line SL3, and each source region of the cell transistors CT4 and CT8 is connected to a source line SL4.

Each drain region of the cell transistors CT1 and CT5 is connected to a data line DL1, and each drain region of the cell transistors CT2 and CT6 is connected to a data line DL2 In addition, each drain region of the cell transistors CT3 and CT7 is connected to a data line DL3, and each drain region of the cell transistors CT4 and CT8 is connected to a data line DL4.

Each back gate of the cell transistors CT1, CT2, CT5 and CT6 is connected to a well WE1, and each back gate of the cell transistors CT3, CT4, CT7 and CT8 is connected to a well WE2. Note that the wells WE1 and WE2 correspond to, for example, the p-type well PWM illustrated in FIG. 3.

FIG. 4 illustrates a case in which the memory cells are arranged in two rows and four columns for simplification of description. However, the arrangement is not limited to this, and more memory cells are practically arranged in a matrix form to configure the memory array. In addition, the memory cell array on the same well and the same word line is configured in, for example, two columns of the cell transistors CT1 and CT2 in FIG. 4. However, in a case of a configuration of 8 bits (one byte), cell transistors in eight columns are formed on the same well. In this case, the memory cell is erased and written in a unit of one byte.

Next, erase, write and read operations of the one cell-one transistor memory cell will be explained with reference to FIG. 4.

First, the erase operation will be described. For example, a case is considered, the case in which data stored in the cell transistors CT1 and CT2 as memory cells (selected memory cells) from which data is erased. A potential of the selected well WE1 is set to 1.5 V, a potential of the selected word line WL1 is set to −8.5 V, the potentials of the selected source lines SL1 and SL2 are set to 1.5 V, and the selected data lines DL1 and DL2 are set to a floating state (indicated by "F" in FIG. 4). Then, charges stored in charge storage films of the cell transistors CT1 and CT2 are extracted to the semiconductor substrate side, so that the data is erased therefrom.

At this time, in regard to the cell transistors CT3 to CT8 as other memory cells (unselected memory cells) for which the erasing operation is not performed, a potential of the unselected well WE2 is set to −8.5 V, a potential of the unselected word line WL2 is set to 1.5 V, the potentials of the unselected source lines SL3 and SL4 are set to 1.5 V, and the potentials of the unselected data lines DL3 and DL4 are set to the floating state. Accordingly, charges stored in charge storage films of the cell transistors CT3 to CT8 are not extracted so that the data is not erased therefrom.

Next, the write operation will be described. For example, a case is considered, the case in which the data is written into the cell transistor CT1 as a memory cell (selected memory cell) into which the data is written. A potential of the selected well WE1 is set to −10.5 V, a potential of the selected word line WL1 is set to 1.5 V, a potential of the selected source line SL1 is set to −10.5 V, and the selected data line DL1 is set to the floating state. Then, a charge is implanted into the charge storage film of the cell transistor CT1, and the data is written thereto.

At this time, in regard to the other cell transistors (unselected memory cells) CT2 to CT8 to which the data is not written, the potential of the unselected well WE2 is set to −10.5 V, the potential of the unselected word line WL2 is set to −10.5 V, the potentials of the unselected source lines SL2 to SL4 are set to 1.5 V, and the potentials of the unselected data lines DL2 to DL4 are set to the floating state. Accordingly, a charge is not implanted into the charge storage films of the cell transistor CT2 to CT8.

Next, the read operation will be described. For example, it is assumed that a threshold voltage of the cell transistor CT1 is high as data "1" is written into the transistor, and that a threshold voltage of the cell transistor CT2 is low as data "0" is set in the transistor. When the data of the cell transistors CT1 and CT2 is read, the potential of the selected well WE1 is set to −2 V, the potential of the selected word line WL1 is set to 0 V, the potentials of the selected source lines SL1 and SL2 are set to 0 V, and the potentials of the selected data lines DL1 and DL2 are set to 1.0 V. Accordingly, the data of the cell transistors CT1 and CT2 is read. In this case, the potential of the data line DL1 does not change, and the potential of the data line DL2 decreases since the threshold voltage of the cell transistor CT1 is high and the threshold voltage of the cell transistor CT2 is low.

In addition, in regard to the other cell transistors CT3 to CT8 from which the data is not read, the potential of the unselected well WE2 is set to −2 V, the potential of the unselected word line WL2 is set to −2 V, the potentials of the unselected source lines SL3 and SL4 are set to 0 V, and the potentials of the unselected data line DL3 and DL4 are set to 0 V so as not to turn on the cell transistors CT3 to CT8. As a back gate potential of the unselected memory cell is decreased at the time of read, the select transistor is not required in the memory cell.

<Method of Manufacturing Semiconductor Device>

Next, a method of manufacturing the semiconductor device of the present embodiment will be described. The method of manufacturing the semiconductor device according to the present embodiment is a manufacturing method which is called "MONOS LAST". This manufacturing method which is called "MONOS LAST" has an advantage in which, particularly, an excessive application of a thermal load on the MONOS transistor can be suppressed.

The present embodiment is based on a premise that the power transistor and the MONOS transistor are mixedly mounted. At this time, as a manufacturing condition, an extremely large thermal load is applied on the power transistor since the power transistor controls a high voltage and current due to its application. Thus, when the power transistor and the MONOS transistor are mixedly mounted, there is a concern that a characteristic of the MONOS transistor is influenced by the large thermal load at the time of forming the power transistor.

Thus, in the present embodiment, the manufacturing method which is called "MONOS LAST" is employed. In the manufacturing method which is called "MONOS LAST", the conductive film for the well and the gate electrode of the power transistor or others is formed in the main circuit formation region AR, and then, the insulating film for the well and the gate insulating film of the MONOS transistor is formed in the memory formation region MR. Accordingly, the excessive application of the thermal load on the MONOS transistor can be suppressed. Hereinafter, the method of manufacturing the semiconductor device according to the present embodiment which uses the manufacturing method called "MONOS LAST" will be described.

Figure 5:
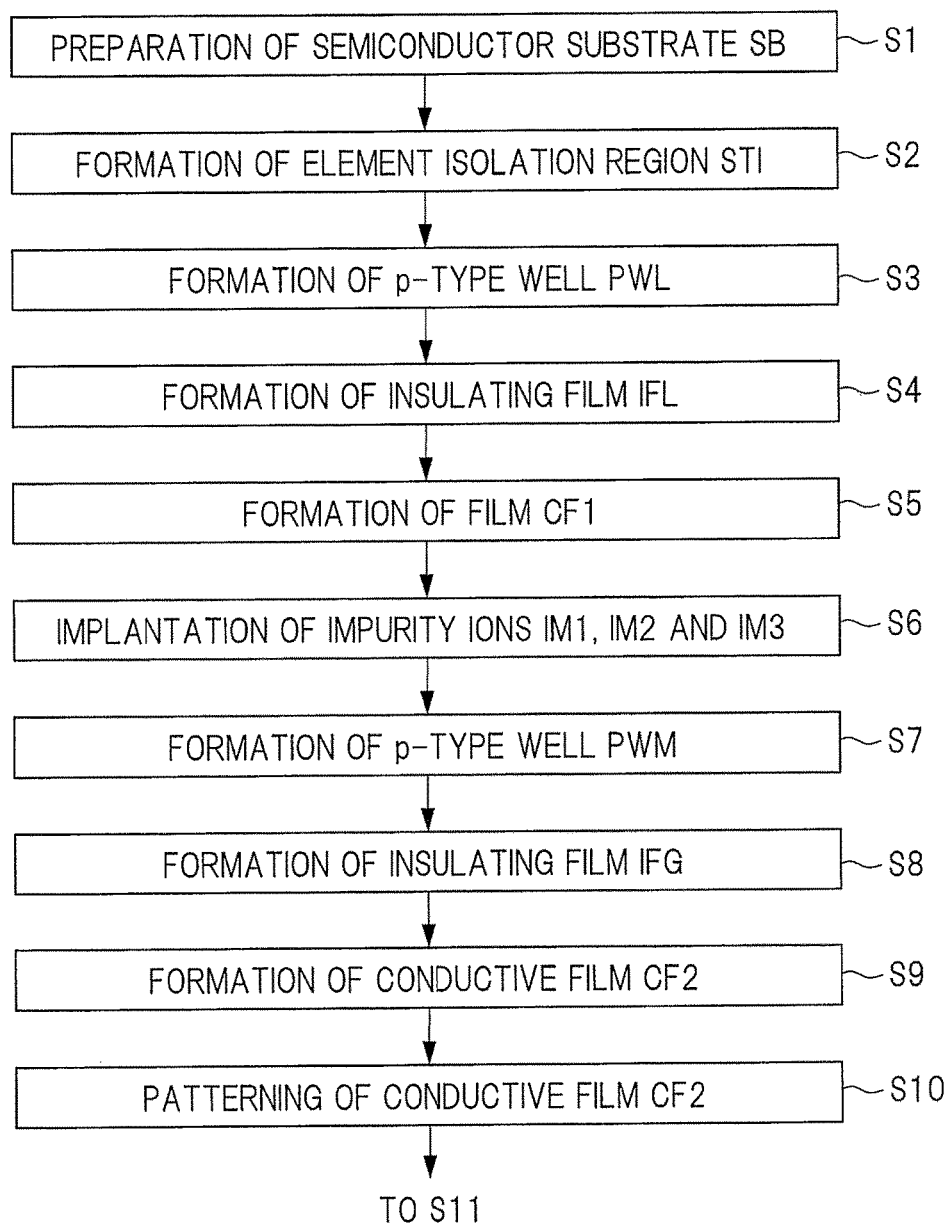
FIG. 5 is a process flow diagram illustrating a part of a process of manufacturing the semiconductor device according to the embodiment.
Figure 6:
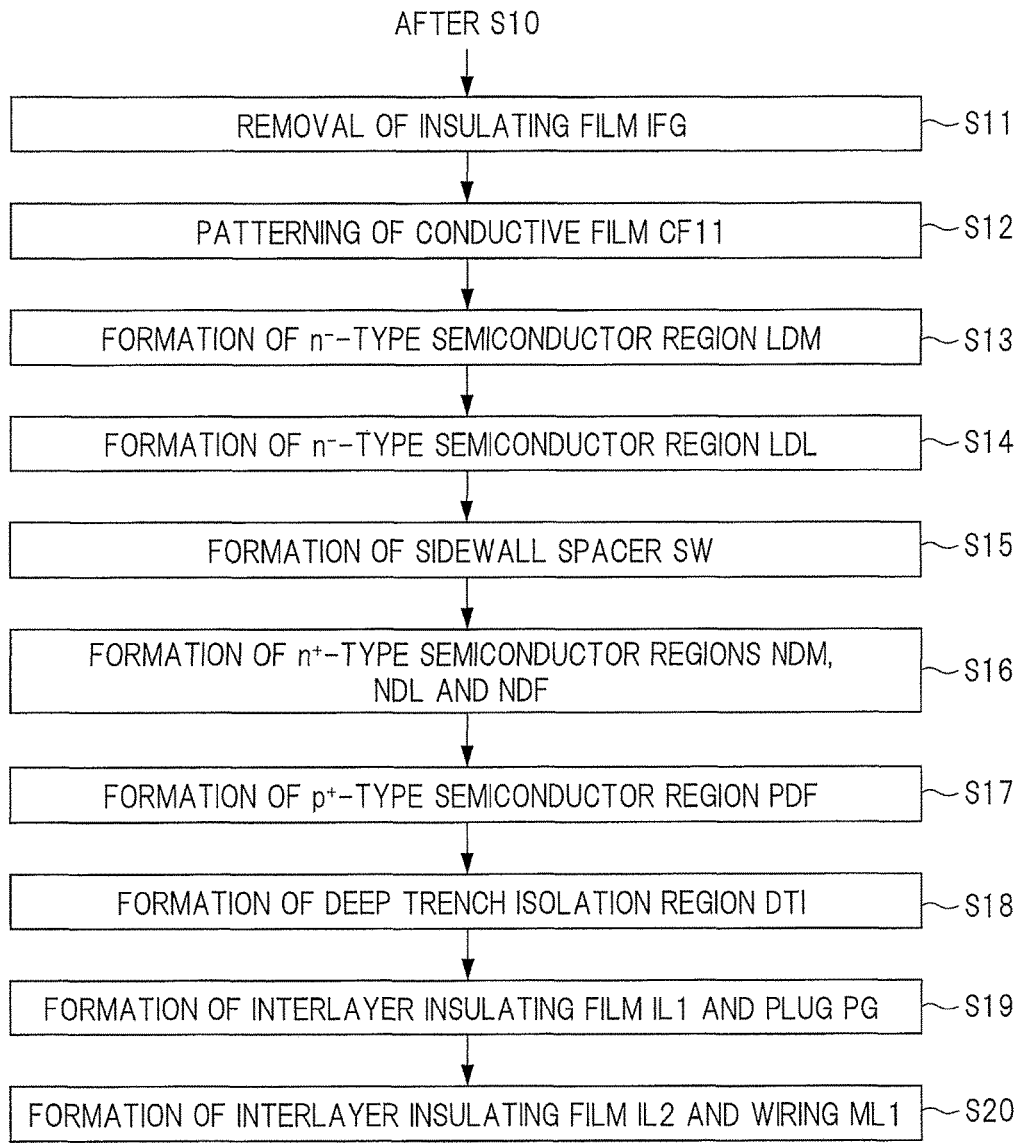
FIG. 6 is a process flow diagram illustrating a part of the process of manufacturing the semiconductor device according to the embodiment.

FIGS. 5 and 6 are process flowcharts illustrating a part of a process of manufacturing the semiconductor device of the embodiment. FIGS. 7 to 22 are cross-sectional view of a principal part during the process of manufacturing the semiconductor device of the embodiment. FIGS. 7 to 22 illustrate the cross-sectional view of a principal part of the memory formation region MR and the main circuit formation region AR.

In the present embodiment, the case of forming the n-channel MONOS transistor MC (see FIG. 20 described later) in the memory formation region MR will be described. However, a p-channel MONOS transistor MC may be formed by reversing the conductivity type.

Similarly, in the present embodiment, the case of forming the n-channel low-breakdown-voltage MISFET Q1 (see FIG. 20 described later) in the low-breakdown-voltage MISFET formation region LR of the main circuit formation region AR will be described. However, a p-channel low-breakdown-voltage MISFET Q1 can be also formed in the low-breakdown-voltage MISFET formation region LR by reversing the conductivity type, or a complementary MISFET (CMISFET) formed of two low-breakdown-voltage MISFET's Q1 of the n-channel type and the p-channel type which are connected to each other in series can be also formed.

Further, similarly, in the present embodiment, the case of forming the n-channel power transistor Q2 (see FIG. 21 described later) in the power transistor formation region PWR of the main circuit formation region AR will be described. However, a p-channel power transistor Q2 can be also formed in the power transistor formation region PWR by reversing the conductivity type, or the n-channel and p-channel power transistors Q2 which are connected to each other in series can be also formed.

Figure 7:
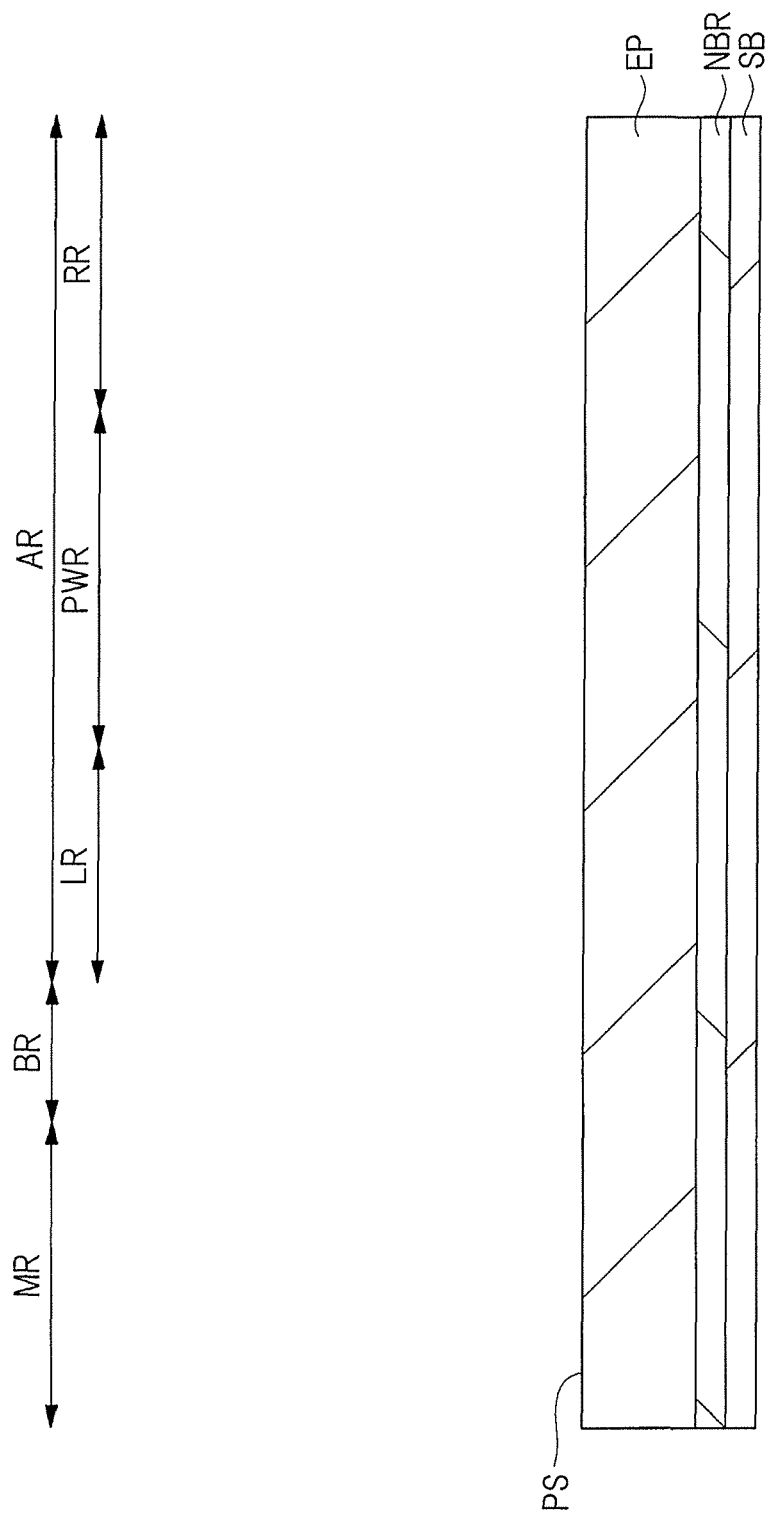
FIG. 7 is a cross-sectional view of a principal part in the middle of the process of manufacturing the semiconductor device according to the embodiment.

First, as illustrated in FIG. 7, the semiconductor substrate SB is prepared (Step S1 in FIG. 5). In this Step S1, a p-type impurity such as boron (B) is introduced. The semiconductor substrate SB that is made of a silicon single crystal, which has a specific resistance of about, for example, 0.01 to 0.1 Ωm is prepared. At this time, the semiconductor substrate SB is formed in a semiconductor wafer state with a substantially disc shape.

The semiconductor substrate SB has the memory formation region MR, the low-breakdown-voltage MISFET formation region LR, the power transistor formation region PWR, and the resistance element formation region RR as a partial region of the upper surface PS serving as the main surface. The main circuit formation region AR is formed of the low-breakdown-voltage MISFET formation region LR, the power transistor formation region PWR, and the resistance element formation region RR.

The n-type buried region NBR is formed on the upper surface PS side, which is the main surface of the semiconductor substrate SB, and the p⁻-type epitaxial layer EP is formed on the n-type buried region NBR in the memory formation region MR, the low-breakdown-voltage MISFET formation region LR, the power transistor formation region PWR, and the resistance element formation region RR. Note that a buried insulating layer instead of the n-type buried region NBR may be formed on the semiconductor substrate SB, and then, a silicon layer instead of the p⁻-type epitaxial layer EP may be formed on the buried insulating layer.

Figure 8:
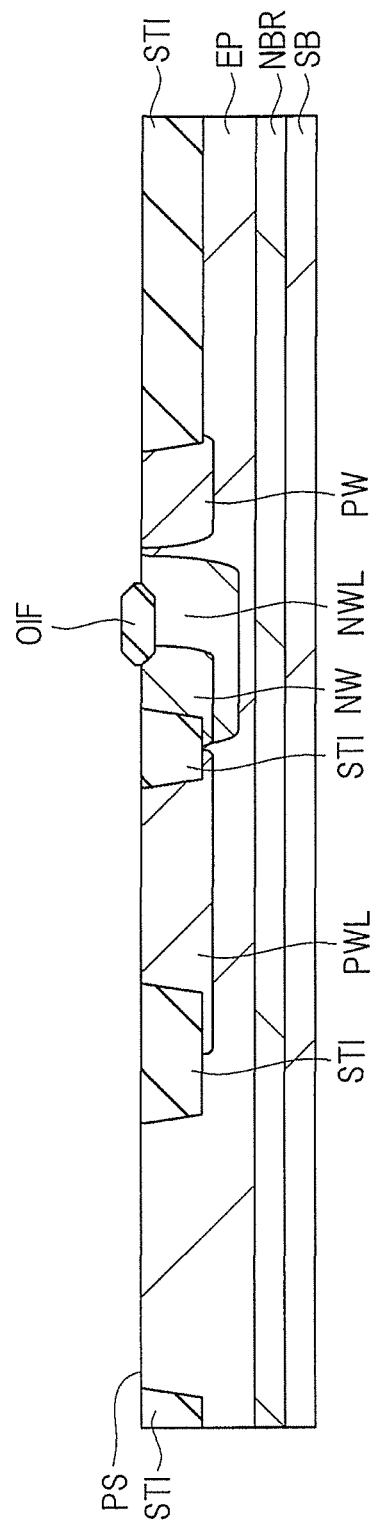
FIG. 8 is a cross-sectional view of a principal part in the middle of the process of manufacturing the semiconductor device according to the embodiment.

Next, as illustrated in FIG. 8, the element isolation region STI is formed (Step S2 in FIG. 5). In this Step S2, the element isolation region STI is formed by, for example, a shallow trench isolation (STI) method.

In this STI method, first, an element isolation trench is formed in the semiconductor substrate SB by using a photolithography technique and an etching technique. Further, an insulating film made of, for example, a silicon oxide film is formed on the semiconductor substrate SB to bury the element isolation trench, and then, an unnecessary insulating film formed on the semiconductor substrate SB is removed by a chemical mechanical polishing (CMP) method. Accordingly, the element isolation region STI obtained by burying the insulating film only in the element isolation trench can be formed. Note that the element isolation region STI may be formed by using a method of local oxidation of silicon (LOCOS) instead of the STI method.

In this manner, by forming the element isolation region STI, the memory formation region MR and the main circuit formation region AR are partitioned from each other by the element isolation region STI, and the main circuit formation region AR is partitioned into the low-breakdown-voltage MISFET formation region LR and the power transistor formation region PWR. Meanwhile, in the resistance element formation region RR, the insulating film serving as the element isolation region STI is formed on the upper surface PS, which is the main surface of the semiconductor substrate SB, over the entire resistance element formation region RR.

Next, as illustrated in FIG. 8, the p-type well PWL is formed (Step S3 in FIG. 5).

In this Step S3, the p-type impurity such as boron (B) is implanted into the semiconductor substrate SB by the photolithography technique and the ion implantation method. At this time, a p-type impurity ion is implanted into the semiconductor substrate SB in the low-breakdown-voltage MISFET formation region LR and the power transistor formation region PWR. Accordingly, the p-type well PWL is formed inside the p⁻-type epitaxial layer EP in the low-breakdown-voltage MISFET formation region LR, and the p-type well PW is formed inside the p⁻-type epitaxial layer EP in the power transistor formation region PWR. In other words, in Step S3, the semiconductor substrate SB is prepared, the semiconductor substrate SB having the p-type semiconductor region formed on the upper surface PS side of the semiconductor substrate SB in the low-breakdown-voltage MISFET formation region LR and the power transistor formation region PWR.

In addition, in this Step S3, an n-type impurity such as phosphorus (P) or arsenic (As) is implanted into the semiconductor substrate SB by using the photolithography technique and the ion implantation method. At this time, in the power transistor formation region PWR, an n-type impurity ion is implanted into the semiconductor substrate SB. Accordingly, in the power transistor formation region PWR, the n-type well NWL is formed inside the p⁻-type epitaxial layer EP, and the n-type well NW is formed in an upper layer portion of the n-type well NWL.

Although not illustrated, in a case of formation of the p-channel low-breakdown-voltage MISFET in the low-breakdown-voltage MISFET formation region LR, note that an n-type well for a p-channel low-breakdown-voltage MISFET is formed in the low-breakdown-voltage MISFET formation region LR at the time of implanting the n-type impurity ion into the semiconductor substrate SB. In addition, in a case of formation of the p-channel power transistor in the power transistor formation region PWR, a p-type well for a p-channel power transistor is formed in the power transistor formation region PWR at the time of implanting the p-type impurity ion into the semiconductor substrate SB.

In addition, an n-type well for a p-channel power transistor is formed in the power transistor formation region PWR at the time of implanting the n-type impurity ion in the semiconductor substrate SB.

In the power transistor formation region PWR, note that the offset insulating film OIF is formed on surfaces of the n-type well NW and the n-type well NWL by, for example, the LOCOS method.

Next, an insulating film IFL is formed as illustrated in FIG. 9 (Step S4 in FIG. 5). In this Step S4, the insulating film IFL for the gate insulating film of the low-breakdown-voltage MISFET Q1 (see FIG. 20 described later) is formed on the upper surface PS of the semiconductor substrate SB in the memory formation region MR, the low-breakdown-voltage MISFET formation region LR, and the power transistor formation region PWR. The insulating film IFL is formed on the p⁻-type epitaxial layer EP in the memory formation region MR, and the insulating film IFL is formed on the p-type well PWL in the low-breakdown-voltage MISFET formation region LR. In addition, in the power transistor formation region PWR, the insulating film IFL is formed on the n-type well NW, on the n-type well NWL, on the p⁻-type epitaxial layer EP, and on the p-type well PW. Note that the insulating film IFL is formed to be integrated with the offset insulating film OIF in the power transistor formation region PWR.

As the insulating film IFL, for example, an insulating film made of, silicon oxide, silicon nitride or silicon oxynitride, or a High-k film, that is, a high-dielectric-constant film can be used. In addition, the insulating film IFL can be formed by using a thermal oxidation method, an in-situ steam generation (ISSG) oxidation method, a sputtering method, an atomic layer deposition (ALD) method, a chemical vapor deposition (CVD) method, or others.

Next, the film CF1 is formed as illustrated in FIG. 9 (Step S5 in FIG. 5). In this Step S5, the film CF1 for the gate electrode, which is made of silicon, is formed on the insulating film IFL in the memory formation region MR, the low-breakdown-voltage MISFET formation region LR, and the power transistor formation region PWR. In addition, in the resistance element formation region RR, the film CF1 is formed on the insulating film as the element isolation region STI. In the memory formation region MR, note that another insulating film, which is different from the insulating film IFL, may be formed on the semiconductor substrate SB.

Preferably, the film CF1 is made of, polycrystalline silicon, that is, polysilicon. Such a film CF1 can be formed by using the CVD method or others. A thickness of the film CF1 can be as much enough as to cover the insulating film IFL. In addition, at the time of deposition of the film CF1, the film CF1 can be deposited first as an amorphous silicon film, and then, the amorphous silicon film can be formed as the polycrystalline silicon film by the subsequent heat treatment.

Figure 10:
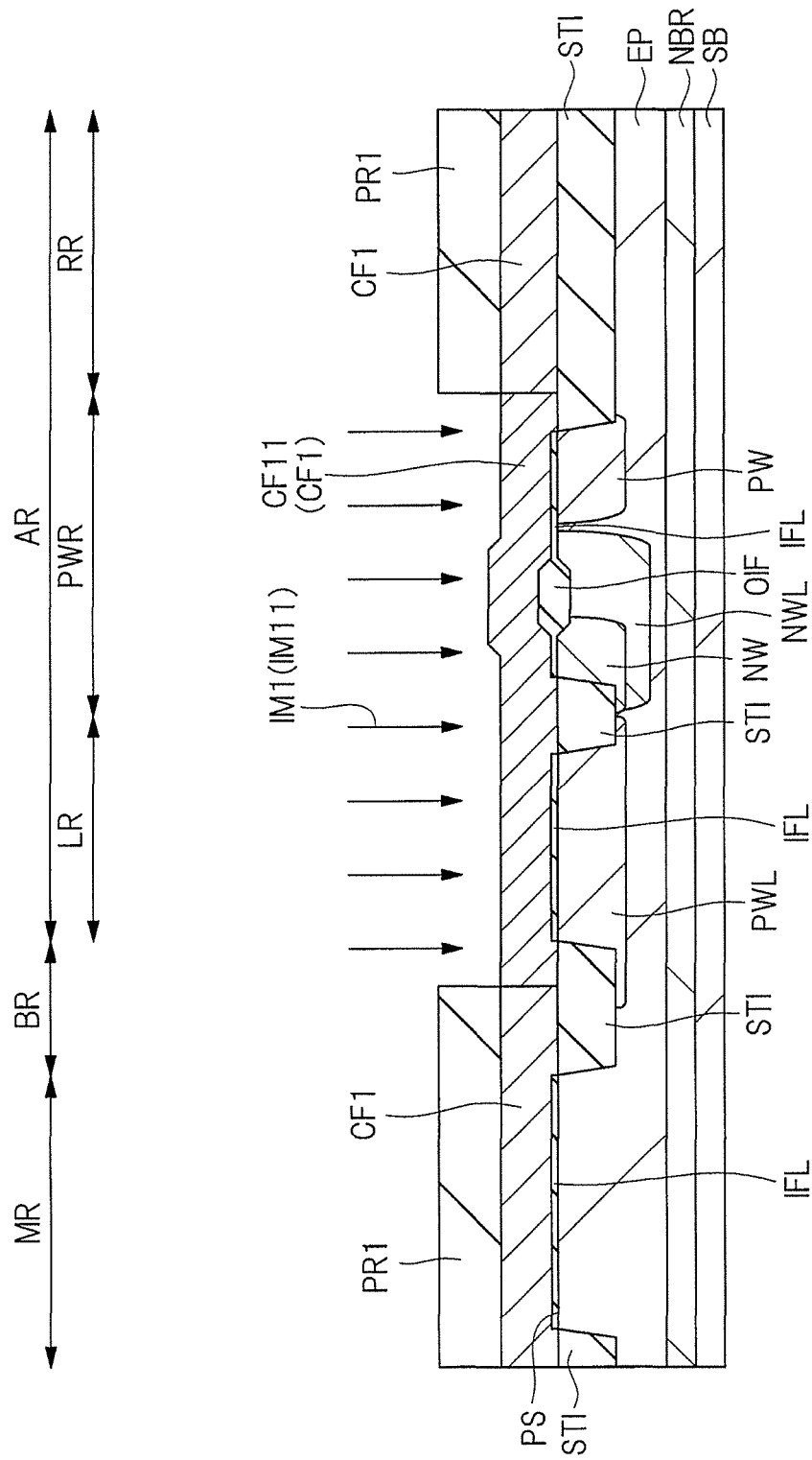
FIG. 10 is a cross-sectional view of a principal part in the middle of the process of manufacturing the semiconductor device according to the embodiment.
Figure 11:
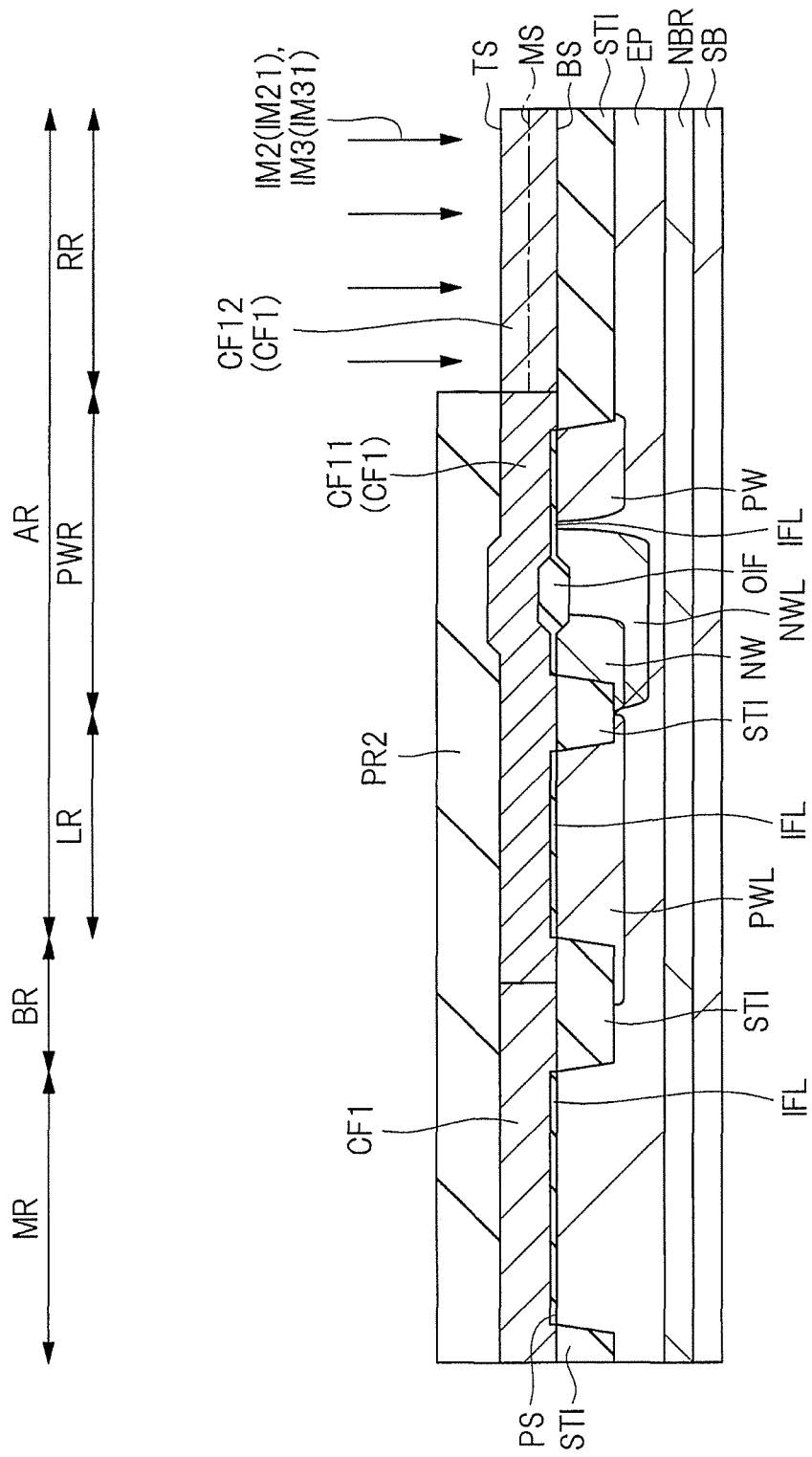
FIG. 11 is a cross-sectional view of a principal part in the middle of the process of manufacturing the semiconductor device according to the embodiment.

Next, impurity ions IM1, IM2 and IM3 are implanted into the film CF1 as illustrated in FIGS. 10 and 11 (Step S6 in FIG. 5).

In this Step S6, first, a resist film PR1 is applied onto the film CF1, and the applied resist film PR1 is patterned by using the photolithography technique as illustrated in FIG. 10. The resist film PR1 is patterned so that the film CF1 is covered by the resist film PR1 in the memory formation region MR and the resistance element formation region RR and so that the film CF1 of a portion formed on the insulating film IFL is exposed from the resist film PR1 in the low-breakdown-voltage MISFET formation region LR and the power transistor formation region PWR.

Next, an n-type impurity IM11 such as phosphorus (P) or arsenic (As) is implanted into the film CF1 of the portion exposed from the resist film PR1 by the ion implantation method using the patterned resist film PR1 as a mask. That is, the n-type impurity ion IM1 is implanted into the film CF1 of the portion formed on the insulating film IFL. Accordingly, the conductive film CF11, which is formed of the film CF1 of the portion in which the n-type impurity ion IM1 is ion-implanted, is formed in the low-breakdown-voltage MISFET formation region LR and the power transistor formation region PWR. Then, the patterned resist film PR1 is removed by, for example, ashing.

In this Step S6, next, as illustrated in FIG. 11, a resist film PR2 is applied onto the film CF1, and the applied resist film PR2 is patterned by using the photolithography technique. The resist film PR2 is patterned so that the film CF1 is covered by the resist film PR1 in the memory formation region MR, the low-breakdown-voltage MISFET formation region LR, and the power transistor formation region PWR, and so that the film CF1, which is formed on the insulating film as the element isolation region STI, is exposed from the resist film PR2 in the resistance element formation region RR.

Next, an impurity IM21 for suppression of the growth of the crystal grains is introduced into the film CF1 of the portion exposed from the resist film PR2 by the ion implantation method using the patterned resist film PR2 as a mask. That is, the impurity ion IM2 is implanted into the film CF1 of the portion formed on the insulating film as the element isolation region STI.

Accordingly, when the insulating film IF1, the charge storage film EC, and the insulating film IF2 (see FIG. 13 described later) are formed after that, the growth of the crystal grain in the film CF1 can be prevented or suppressed even when the semiconductor substrate SB is subjected to the heat treatment, for example, at high temperature of 1150° C. for about two hours. Thus, after that, in each set formed of the N (N is plural) resistance elements connected in parallel, the variation of the resistance differences among the N resistance elements can be prevented or suppressed, and the deterioration of the so-called mismatch characteristic of resistance can be prevented or suppressed. Note that a method other than ion implantation method may be used as the method of introducing the impurity IM21 into the film CF1.

As the impurity IM21, it is possible to use at least one type of elements selected from a group including, for example, carbon (C), silicon (Si), germanium (Ge), nitrogen (N), argon (Ar), helium (He), and xenon (Xe), or an element having the chemical characteristics similar to the chemical characteristics of the element. That is, as the impurity IM21 for suppression of the growth of the crystal grains, it is possible to use at least one type of elements selected from groups of a group 14 element, nitrogen (N), and a group 18 element.

In addition, a p-type impurity IM31 such as boron (B) is introduced into the film CF1 of the portion exposed from the resist film PR2 by the ion implantation method using the patterned resist film PR2 as the mask. That is, the p-type impurity ion IM3 is implanted into the film CF1 of the portion exposed from the resist film PR2.

Accordingly, a film portion CF12, which is formed of the film CF1 of the portion into which the impurity IM21 and the p-type impurity IM31 are ion-implanted, is formed in the resistance element formation region RR. A p-type impurity concentration of the film portion CF12 is adjusted so that a resistance value of the resistor body RB (see FIG. 16 described later) is set to a desired resistance value.

Either one of the process of ion-implanting the impurity ion IM2 and the process of ion-implanting the impurity ion IM3 may be performed first, or both the process may be performed at the same time. However, it is preferable to perform the process of ion-implanting the impurity ion IM2 before the process of ion-implanting the p-type impurity ion IM3. Accordingly, it is possible to reliably perform the ion-implantation of the impurity ion IM2 into any depth position from an upper surface TS to a bottom surface BS of the film CF1, and thus, it is possible to reliably suppress the growth of the crystal grains at any depth position from the upper surface TS to the bottom surface BS of the film CF1.

Preferably, a concentration distribution of the impurity ion IM2 in a thickness direction of the film portion CF12, that is, the impurity IM21 has a peak between the upper surface TS of the film portion CF12 and the bottom surface BS of the film portion CF12, and the peak is arranged on the bottom (lower) surface BS side than an intermediate surface MS positioned at the middle of the upper surface TS and the bottom surface BS. Accordingly, in the thickness direction of the film portion CF12, it is possible to sufficiently introduce the impurity IM21 into the film portion CF12 of the portion arranged on the bottom (lower) surface BS side than the intermediate surface MS. Further, in the thickness direction of the film portion CF12, it is possible to reliably suppress the growth of the crystal grains of the polycrystalline silicon film also in the film portion CF12 of the portion arranged on the bottom (lower) surface BS side than the intermediate surface MS.

This is because the element isolation region STI having a film thickness thicker than a film thickness of the insulating film IFL is formed below the film CF1 in the resistance element formation region RR as different from a region other than the resistance element formation region RR, and therefore, there is no risk in which the implanted impurity ion IM2 penetrates through the element isolation region STI.

Then, the patterned resist film PR2 is removed by, for example, ashing.

Figure 12:
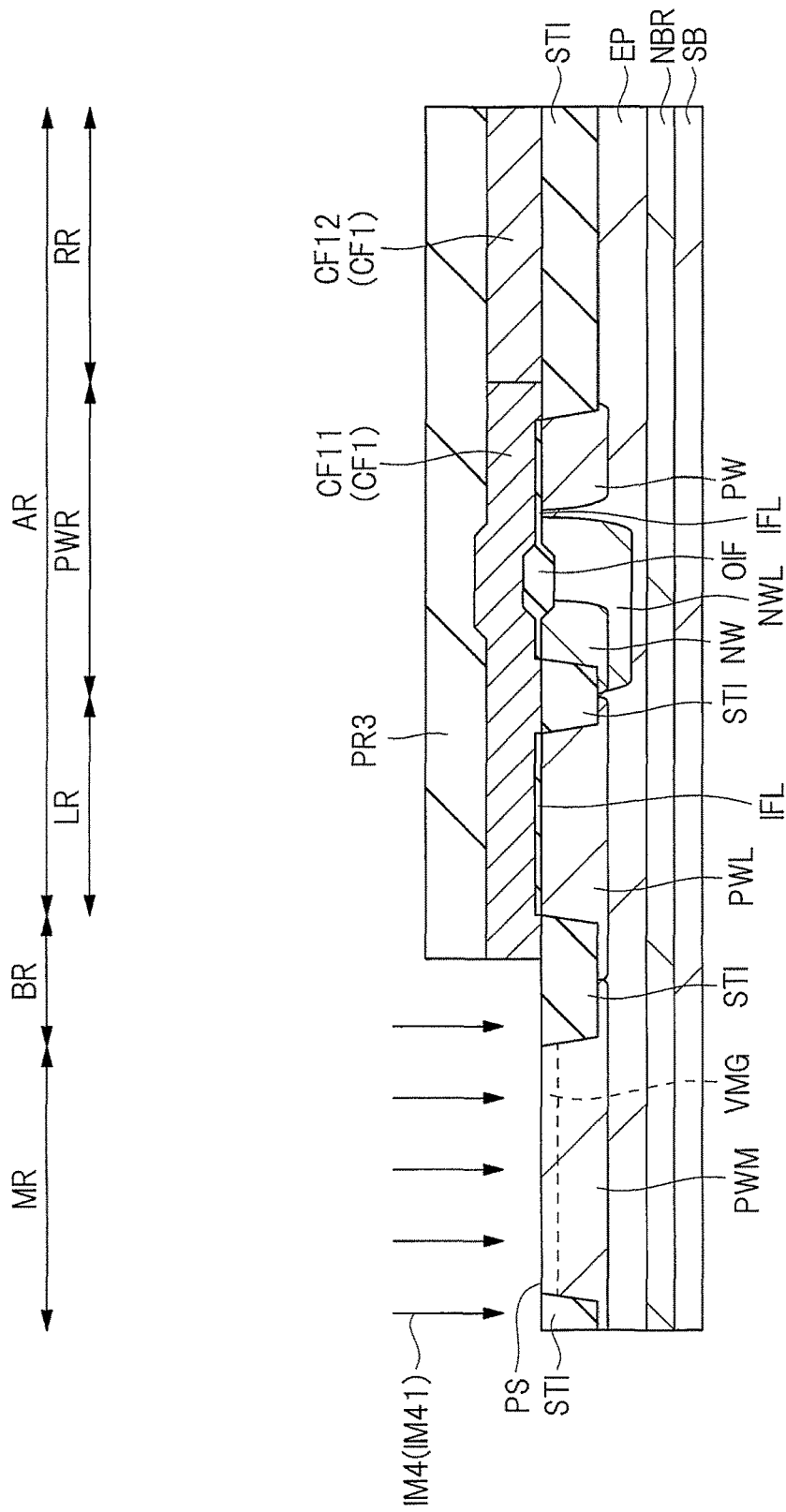
FIG. 12 is a cross-sectional view of a principal part in the middle of the process of manufacturing the semiconductor device according to the embodiment.

Next, as illustrated in FIG. 12, the p-type well PWM is formed in the memory formation region MR (Step S7 in FIG. 5).

In this Step S7, first, as illustrated in FIG. 12, a resist film PR3 is applied on the upper surface PS of the semiconductor substrate SB, and the applied resist film PR3 is patterned by using the photolithography technique. The resist film PR3 is patterned so that the film CF1 is covered by the resist film PR3 in the low-breakdown-voltage MISFET formation region LR, the power transistor formation region PWR, and the resistance element formation region RR, and so that the film CF1 is exposed from the resist film PR3 in the memory formation region MR.

In this Step S7, next, the film CF1 and the insulating film IFL of a portion exposed from the resist film PR3 are removed in the memory formation region MR by the etching technique using the patterned resist film PR3 as a mask. Accordingly, the p⁻-type epitaxial layer EP is exposed from the resist film PR3 in the memory formation region MR. In addition, the conductive film CF11 is left in the low-breakdown-voltage MISFET formation region LR and the power transistor formation region PWR, and the film portion CF12 is left in the resistance element formation region RR.

Subsequently, a p-type impurity IM41 such as boron (B) is introduced into the p⁻-type epitaxial layer EP of the portion exposed from the resist film PR3 by the ion implantation method using the patterned resist film PR3 as the mask. That is, the p-type impurity ion IM4 is implanted into the p⁻-type epitaxial layer EP of the portion exposed from the resist film PR3. Accordingly, the p-type well PWM is formed inside the p⁻-type epitaxial layer EP in the memory formation region MR. That is, the p-type well PWM serving as the p-type semiconductor region is formed on the upper surface PS side of the semiconductor substrate SB in the memory formation region MR.

Further, the n-type impurity such as arsenic (As) or the p-type impurity such as boron (B) is ion-implanted into the p-type well PWM. Accordingly, the p-type semiconductor region VMG is formed in the upper layer portion of the p-type well PWM, that is, the portion where the channel region is to be formed in the memory formation region MR. The p-type semiconductor region VMG is configured to adjust a threshold voltage of the MONOS transistor. Then, the patterned resist film PR3 is removed by, for example, ashing.

In this manner, when the film CF1 and the insulating film IFL are removed in the memory formation region MR after implanting the impurity ion IM2, it is possible to form the resist film PR3, which is the mask to implant the p-type impurity ion IM4, on the flat film CF1, and it is possible to improve a shape accuracy of the patterned resist film PR3.

Figure 13:
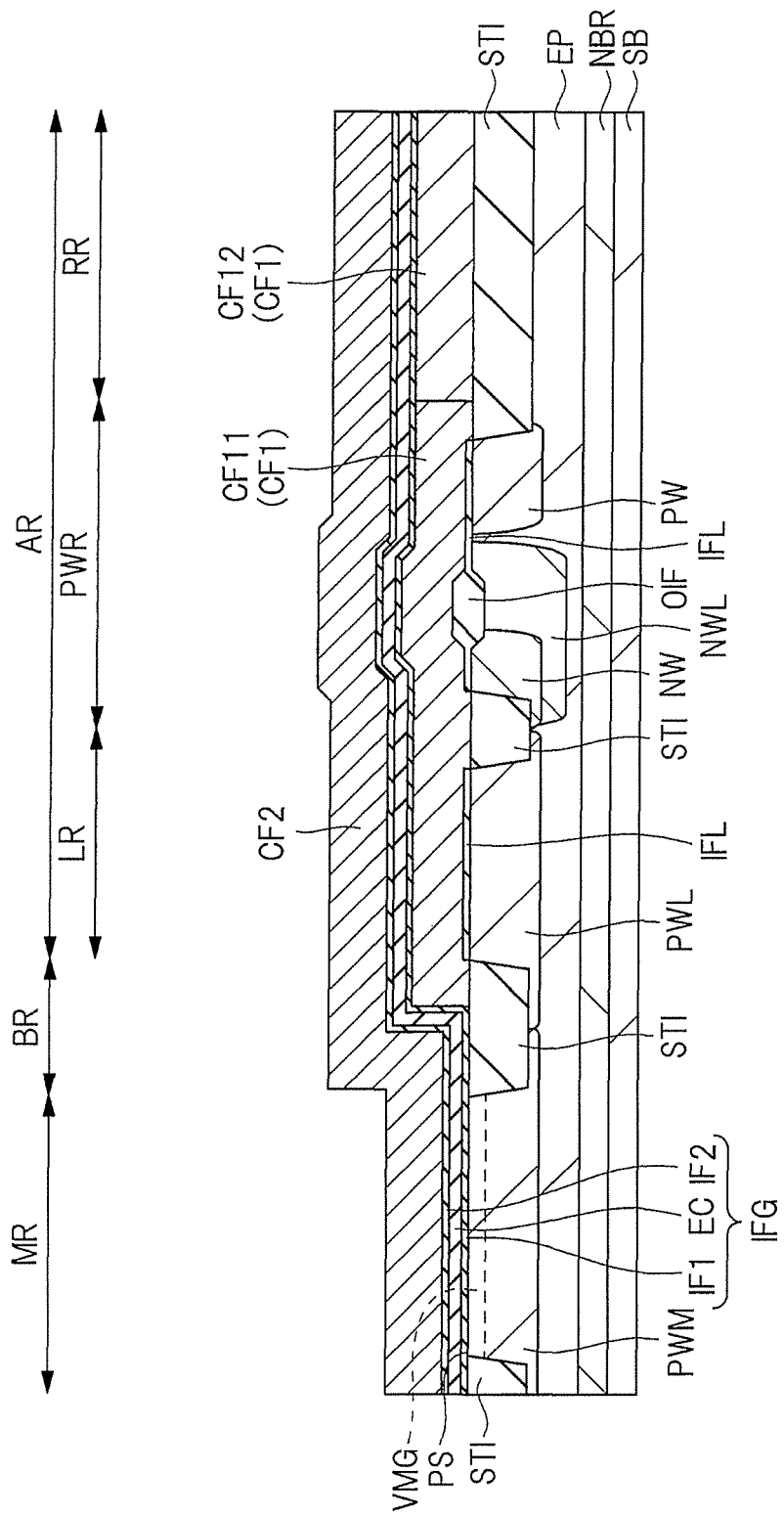
FIG. 13 is a cross-sectional view of a principal part in the middle of the process of manufacturing the semiconductor device according to the embodiment.

Next, as illustrated in FIG. 13, the insulating film IFG is formed (Step S8 in FIG. 5). In this Step S8, first, the insulating film IF1 is formed (deposited) on the upper surface PS of the semiconductor substrate SB in the memory formation region MR, the low-breakdown-voltage MISFET formation region LR, the power transistor formation region PWR, and the resistance element formation region RR, the charge storage film EC is formed (deposited) on the insulating film IF1, and the insulating film IF2 is formed (deposited) on the charge storage film EC. The insulating film IFG is formed of the insulating film IF1, the charge storage film EC, and the insulating film IF2. That is, the insulating film IFG includes the insulating film IF1, the charge storage film EC, and the insulating film IF2, and is the insulating film that has the charge storage film EC serving as the charge storage portion therein.

The insulating film IF1 is formed on the conductive film CF11, and preferably on a surface of the conductive film CF11 in the low-breakdown-voltage MISFET formation region LR and the power transistor formation region PWR, and is formed on the film portion CF12 in the resistance element formation region RR. The insulating film IF1 is made of, for example, silicon oxide. Preferably, the insulating film IF1 can be formed by an ISSG oxidation method, and accordingly, it is possible to form the insulating film IF1 made of the silicon oxide with a dense and favorable film quality. A thickness of the insulating film IF1 is about, for example, 4 nm.

The charge storage film EC is made of, for example, silicon nitride. For example, the charge storage film EC can be formed by a chemical vapor deposition (CVD) method. A thickness of the charge storage film EC is about, for example, 10 nm.

The insulating film IF2 is made of, for example, silicon oxide. Preferably, the insulating film IF2 can be formed by, for example, a high temperature oxide (HTO) method, and accordingly, it is possible to form the insulating film IF2 made of the silicon oxide with a dense and favorable film quality. A thickness of the insulating film IF2 is about, for example, 5 nm.

As described above, on the upper surface PS of the semiconductor substrate SB, it is possible to form the insulating film IFG with a favorable film quality, which is dense and excellent in breakdown voltage characteristics, as a stacked insulating film. The insulating film IFG is referred to also as an oxide nitride oxide (ONO) film. Heat treatment is performed at high temperature of about 1050 to 1150° C. for about ten minutes to two hours in order to improve the reliability of a memory element by improving a film quality and an interface characteristic in the course of forming the insulating film IFG. For example, the semiconductor substrate SB may be subjected to the heat treatment after depositing the insulating film IFG. Alternatively, the semiconductor substrate SB may be subjected to the heat treatment while depositing the insulating film IFG, that is, simultaneously with depositing the insulating film IFG. For example, it is more preferable that the semiconductor substrate SB be subjected to the heat treatment after depositing the insulating film IF1 and before depositing the charge storage film EC.

Note that the insulating film IFG may be formed in at least the memory formation region MR, and is not necessarily formed in the low-breakdown-voltage MISFET formation region LR, the power transistor formation region PWR, and the resistance element formation region RR.

Next, the conductive film CF2 is formed as illustrated in FIG. 13 (Step S9 in FIG. 5). In this Step S9, the conductive film CF2 for the gate electrode of the low-breakdown-voltage MISFET Q1 (see FIG. 20 described later) and the power transistor Q2 (see FIG. 21 described later) is formed on the insulating film IFG in the memory formation region MR, the low-breakdown-voltage MISFET formation region LR, and the power transistor formation region PWR.

Preferably, the conductive film CF2 is made of polycrystalline silicon, that is, polysilicon. Such a conductive film CF2 can be formed by using the CVD method or others. A thickness of the conductive film CF2 can be as much enough as to cover the insulating film IFG. In addition, it is also possible to deposit the conductive film CF2 as the amorphous silicon film at the time of depositing the conductive film CF2, and then, the amorphous silicon film can be formed as the polycrystalline silicon film by the subsequent heat treatment.

As the conductive film CF2, it is preferable to use a conductive film with a low resistivity by introducing the n-type impurity such as phosphorus (P) or arsenic (As) or the p-type impurity such as boron (B). The impurity can be introduced at the time of deposition of the conductive film CF2 or after the deposition. When the impurity is introduced at the time of deposition of the conductive film CF2, it is possible to deposit the conductive film CF2 into which the impurity is introduced by mixing a doping gas with a gas for the deposition of the conductive film CF2.

On the other hand, when the impurity is introduced after depositing the polycrystalline silicon film or the amorphous silicon film, it is possible to form the conductive film CF2 into which the impurity is introduced by depositing a silicon film without intentionally introducing the impurity, and then, introducing the impurity into this silicon film by using the ion implantation method or others.

Figure 14:
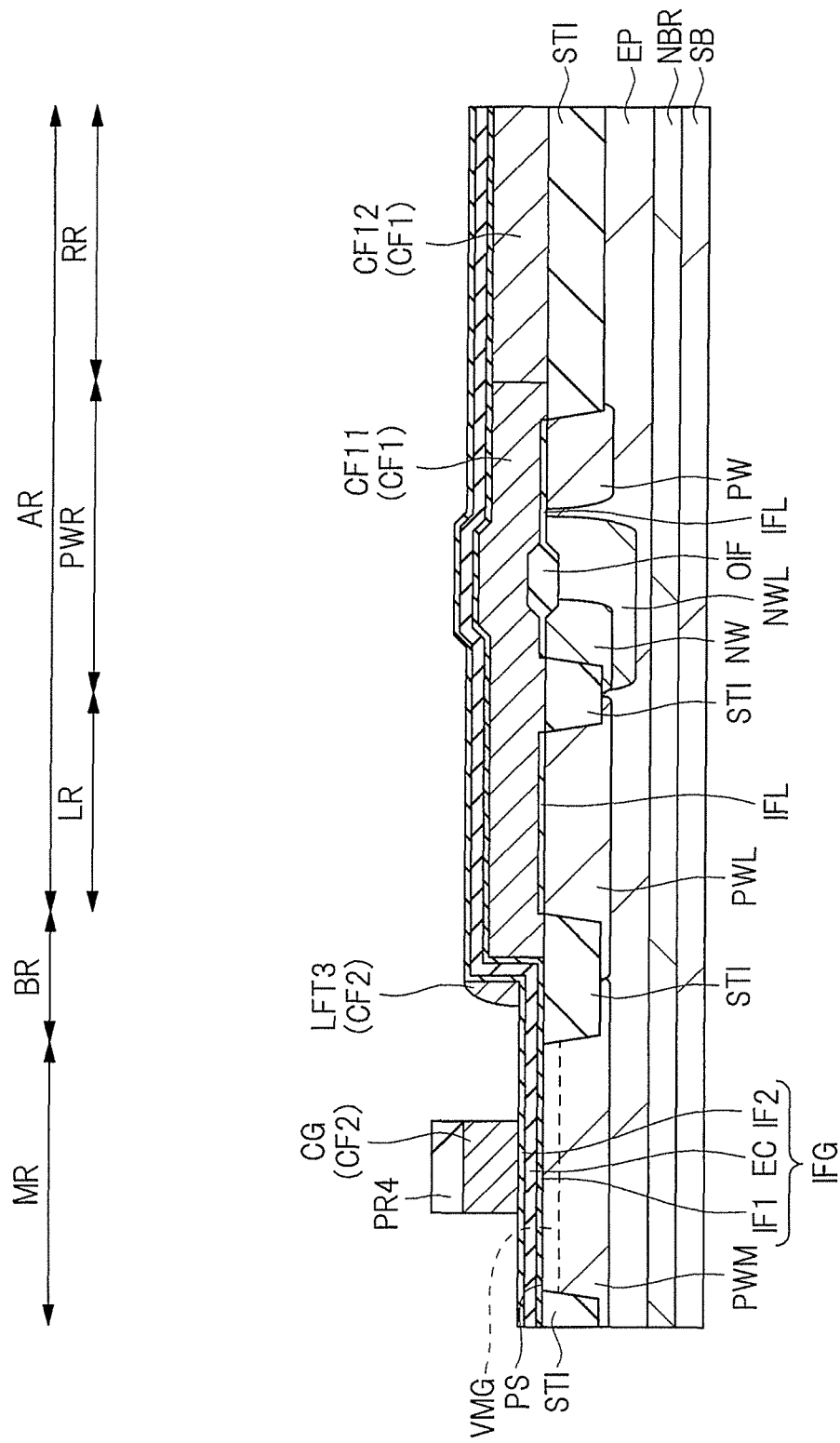
FIG. 14 is a cross-sectional view of a principal part in the middle of the process of manufacturing the semiconductor device according to the embodiment.

Next, the conductive film CF2 is patterned as illustrated in FIG. 14 (Step S10 in FIG. 5).

In this Step S10, first, a resist film PR4 is applied onto the upper surface PS of the semiconductor substrate SB, and the applied resist film PR4 is patterned by using the photolithography technique. The resist film PR4 is patterned so that the conductive film CF2 of a portion of the memory formation region MR, which is arranged in the region where the gate electrode CG is to be formed, is covered by the resist film PR4, and the conductive film CF2 of a portion of the memory formation region MR, which is arranged in a region other than the region whether the gate electrode CG is to be formed, is exposed from the resist film PR4. In addition, the resist film PR4 is patterned so that the conductive film CF2 is exposed from the resist film PR4 in the low-breakdown-voltage MISFET formation region LR and the power transistor formation region PWR.

Next, the conductive film CF2 is etched and patterned by, for example, dry etching or others using the patterned resist film PR4 as a mask. Accordingly, the gate electrode CG, which is formed of the conductive film CF2, is formed in the memory formation region MR. Then, the patterned resist film PR4 is removed by, for example, ashing.

In this Step S10, preferably, the conductive film CF2 is etched back. Accordingly, the conductive film CF2 is left on the side surface of the conductive film CF11 via the insulating film IFG in the boundary region BR to form the residual portion LFT3 as the sidewall portion, the conductive film CF2 of the portion, formed on the upper surface of the conductive film CF11 via the insulating film IFG, is removed, and the conductive film CF2 of the portion, formed on the film portion CF12 via the insulating film IFG, is removed.

Figure 15:
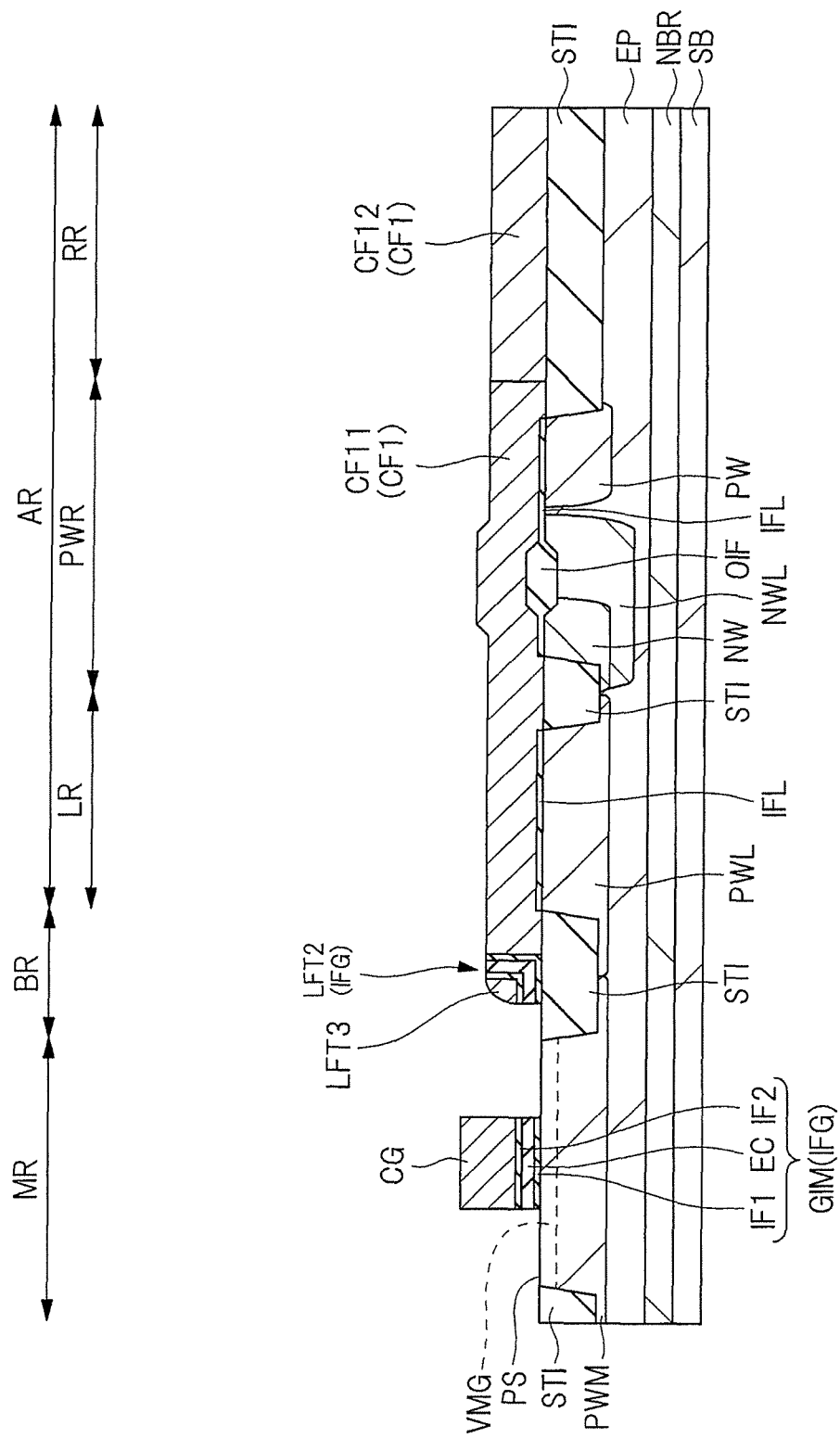
FIG. 15 is a cross-sectional view of a principal part in the middle of the process of manufacturing the semiconductor device according to the embodiment.

Next, the insulating film IFG of the portion exposed from the conductive film CF2 is removed as illustrated in FIG. 15 (Step S11 in FIG. 6). In this Step S11, in the memory formation region MR, the insulating film IFG of the portion exposed from the conductive film CF2, that is, the insulating film IF2, the charge storage film EC and the insulating film IF1 are etched and removed by, for example, dry etching or others using the gate electrode CG, formed of the conductive film CF2, as a mask. That is, in this Step S11, the insulating film IFG of the portion exposed from the conductive film CF2 is removed prior to any process of forming each of the resistor body RB, the gate electrodes GE1 and GE2, and the gate insulating film GI1 and GI2.

In this manner, the gate insulating film GIM, which is formed of the insulating film IFG of the portion between the gate electrode CG and the p-type well PWM of the semiconductor substrate SB is formed in the memory formation region MR. That is, in the memory formation region MR, the gate electrode CG is formed on the p-type well PWM of the semiconductor substrate SB via the gate insulating film GIM.

Meanwhile, the residual portion LFT2 is formed in the boundary region BR, the residual portion LFT2 being formed of the insulating films IFG of the portions between the conductive film CF11 and the residual portion LFT3 serving as the sidewall portion, and between the residual portion LFT3 and the semiconductor substrate SB, that is, the element isolation region STI.

Figure 16:
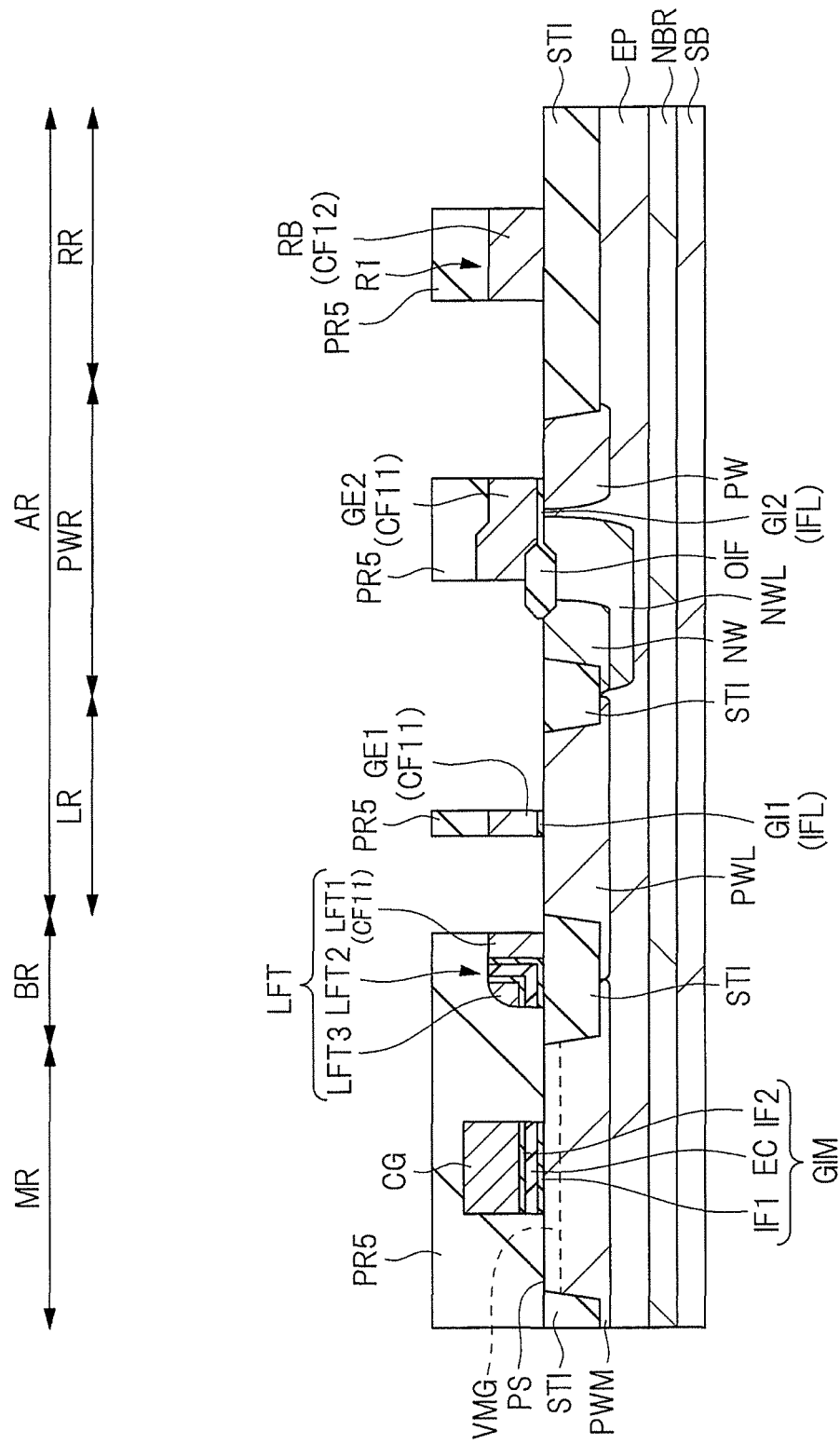
FIG. 16 is a cross-sectional view of a principal part in the middle of the process of manufacturing the semiconductor device according to the embodiment.

Next, the conductive film CF11 is patterned as illustrated in FIG. 16 (Step S12 in FIG. 6).

In this Step S12, first, a resist film PR5 is applied onto the upper surface PS of the semiconductor substrate SB, and the applied resist film PR5 is patterned by using the photolithography technique.

The resist film PR5 is patterned so that the gate electrode CG, the gate insulating film GIM, and the p-type well PWM are covered by the resist film PR5 in the memory formation region MR. In addition, the resist film PR5 is patterned so that the conductive film CF11 of a portion arranged in a region where the gate electrode GE1 is formed is covered by the resist film PR5 in the low-breakdown-voltage MISFET formation region LR, and so that the conductive film CF11 of a portion arranged in a region other than the region where the gate electrode GE1 is formed is exposed from the resist film PR5.

In addition, the resist film PR5 is patterned so that the conductive film CF11 of a portion arranged in a region where the gate electrode GE2 is formed is covered by the resist film PR5 in the power transistor formation region PWR, and so that the conductive film CF11 of a portion arranged in a region other than the region where the gate electrode GE2 is formed is exposed from the resist film PR5. Further, the resist film PR5 is patterned so that the film portion CF12 of a portion arranged in a region where the resistor body RB is formed is covered by the resist film PR5 in the resistance element formation region RR, and so that the film portion CF12 of a portion arranged in a region other than the region where the resistor body RB is formed is exposed from the resist film PR5.

Next, the conductive film CF11 and the film portion CF12 are etched and patterned by, for example, dry etching or others using the patterned resist film PR5 as a mask. Accordingly, the gate electrode GE1, which is formed of the conductive film CF11, is formed, and the gate insulating film GI1, formed of the insulating film IFL of the portion between the gate electrode GE1 and the semiconductor substrate SB, is formed. In addition, in the power transistor formation region PWR, the gate electrode GE2, formed of the conductive film CF11, is formed, and the gate insulating film GI2, formed of the insulating film IFL of the portion between the gate electrode GE2 and the semiconductor substrate SB, is formed. In addition, in the resistance element formation region RR, the resistor body RB, formed of the film portion CF12, is formed, and the resistance element R1 is formed of the resistor body RB. That is, the resistor body RB is formed of the film CF1.

Meanwhile, in the boundary region BR, the residual portion LFT1, which is formed of the conductive film CF11 and serves as a dummy electrode, is formed. As a result, in the boundary region BR, the residual portion LFT3 serving as the sidewall portion is formed on a side surface of the residual portion LFT1 via the residual portion LFT2, and a residual pattern LFT formed of the residual portions LFT1, LFT2 and LFT3 is left.

Then, the patterned resist film PR5 is removed by ashing.

Figure 17:
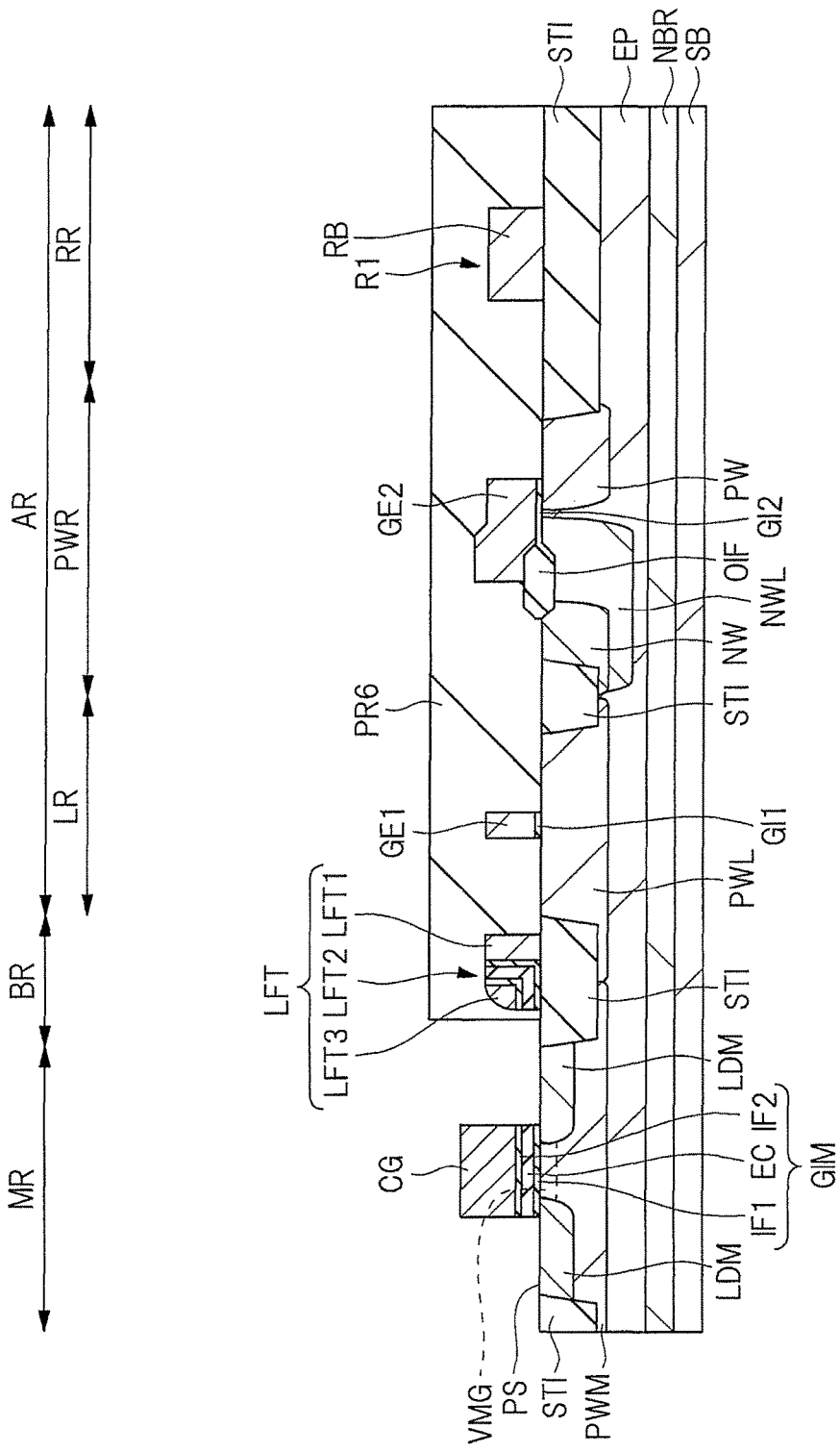
FIG. 17 is a cross-sectional view of a principal part in the middle of the process of manufacturing the semiconductor device according to the embodiment.

Next, the n$^-$-type semiconductor region LDM is formed as illustrated in FIG. 17 (Step S13 in FIG. 6).

In this Step S13, first, a resist film PR6 is applied onto the upper surface PS of the semiconductor substrate SB, and the applied resist film PR6 is patterned by using the photolithography technique. The resist film PR6 is patterned so that the upper surface PS of the semiconductor substrate SB is covered by the resist film PR6 in the low-breakdown-voltage MISFET formation region LR, the power transistor formation region PWR, and the resistance element formation region RR. Meanwhile, in the memory formation region MR, the resist film PR6 is patterned so that the upper surface PS of the semiconductor substrate SB is exposed from the resist film PR6.

Next, the n-type impurity such as arsenic (As) or phosphorus (P) is introduced into the semiconductor substrate SB by the ion implantation method using the patterned resist film PR6 as a mask. At this time, in the memory formation region MR, the n-type impurity ion is implanted into the semiconductor substrate SB by using the gate electrode CG as a mask.

In this manner, in the memory formation region MR, the n$^-$-type semiconductor region LDM is formed in each of upper layer portions of the p-type wells PWM positioned on both sides across the gate electrode CG when seen in a plan view. The n$^-$-type semiconductor region LDM is formed to be aligned with each of both the side surfaces of the gate electrode CG. That is, when seen in a plan view, the n$^-$-type semiconductor region LDM having the conductivity type opposite to the conductivity type of the p-type well PWM is formed in the upper layer portion of the p-type well PWM of the portions adjacent to the gate electrode CG. Then, the patterned resist film PR6 is removed by, for example, ashing.

Figure 18:
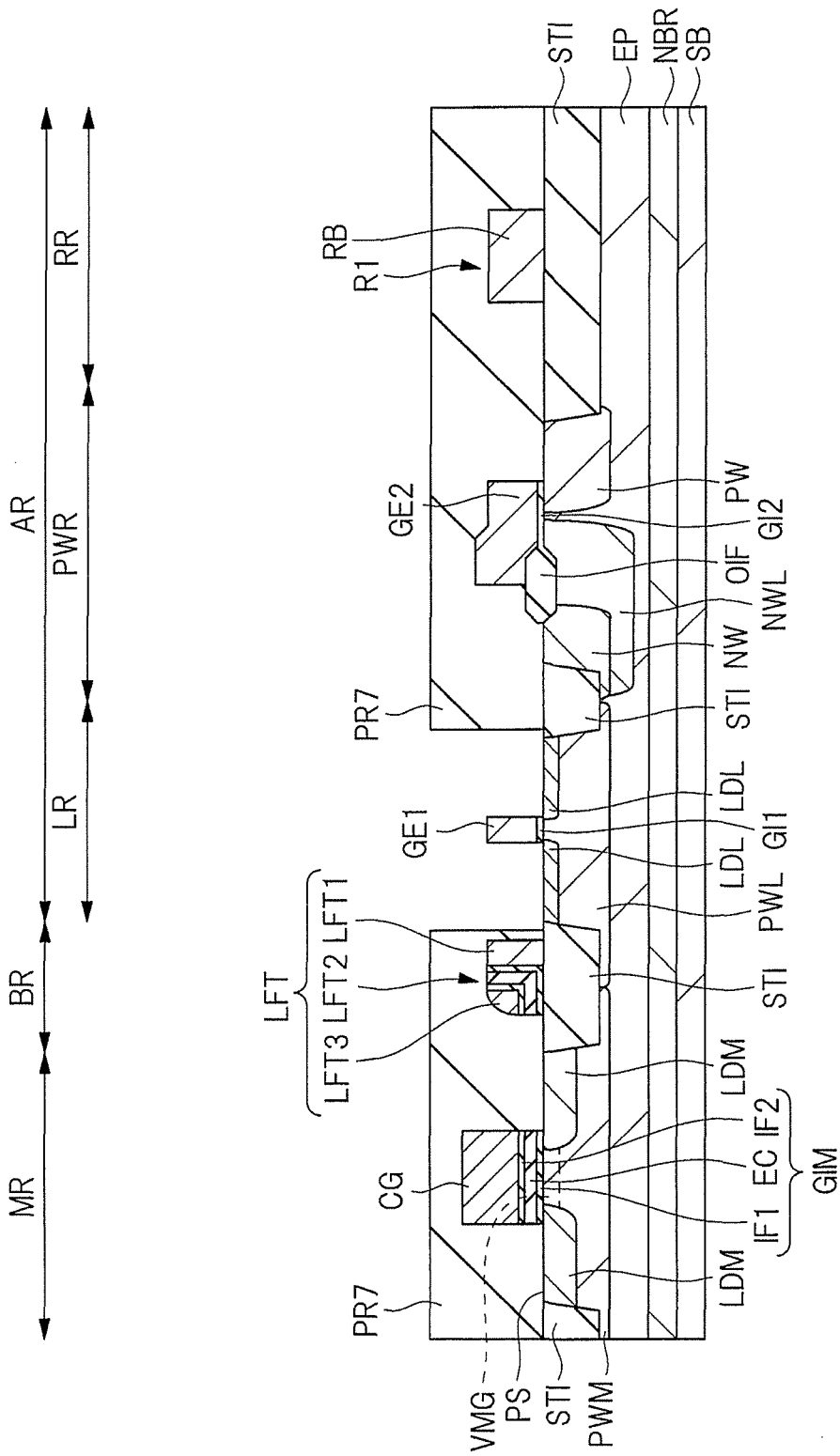
FIG. 18 is a cross-sectional view of a principal part in the middle of the process of manufacturing the semiconductor device according to the embodiment.

Next, the n$^-$-type semiconductor region LDL is formed as illustrated in FIG. 18 (Step S14 in FIG. 6).

In this Step S14, first, a resist film PR7 is applied onto the upper surface PS of the semiconductor substrate SB, and the applied resist film PR7 is patterned by using the photolithography technique. The resist film PR7 is patterned so that the upper surface PS of the semiconductor substrate SB is covered by the resist film PR6 in the memory formation region MR, the power transistor formation region PWR, and the resistance element formation region RR. Meanwhile, in the low-breakdown-voltage MISFET formation region LR, the resist film PR6 is patterned so that the upper surface PS of the semiconductor substrate SB is exposed from the resist film PR6.

Next, the n-type impurity such as arsenic (As) or phosphorus (P) is introduced into the semiconductor substrate SB by the ion implantation method using the patterned resist film PR7 as a mask. At this time, in the low-breakdown-voltage MISFET formation region LR, the n-type impurity ion is implanted into the semiconductor substrate SB by using the gate electrode CG1 as a mask.

In this manner, in the memory formation region MR, the n$^-$-type semiconductor region LDM is formed in each of upper layer portions of the p-type wells PW positioned on both sides across the gate electrode GE1 when seen in a plan view. The n$^-$-type semiconductor region LDL is formed to be aligned with each of both the side surfaces of the gate electrode GE1. That is, when seen in a plan view, the n$^-$-type semiconductor region LDL having the conductivity type opposite to the conductivity type of the p-type well PW is formed in the upper layer portion of the p-type well PW of the portions adjacent to the gate electrode GE1. Then, the patterned resist film PR6 is removed by, for example, ashing.

Figure 19:
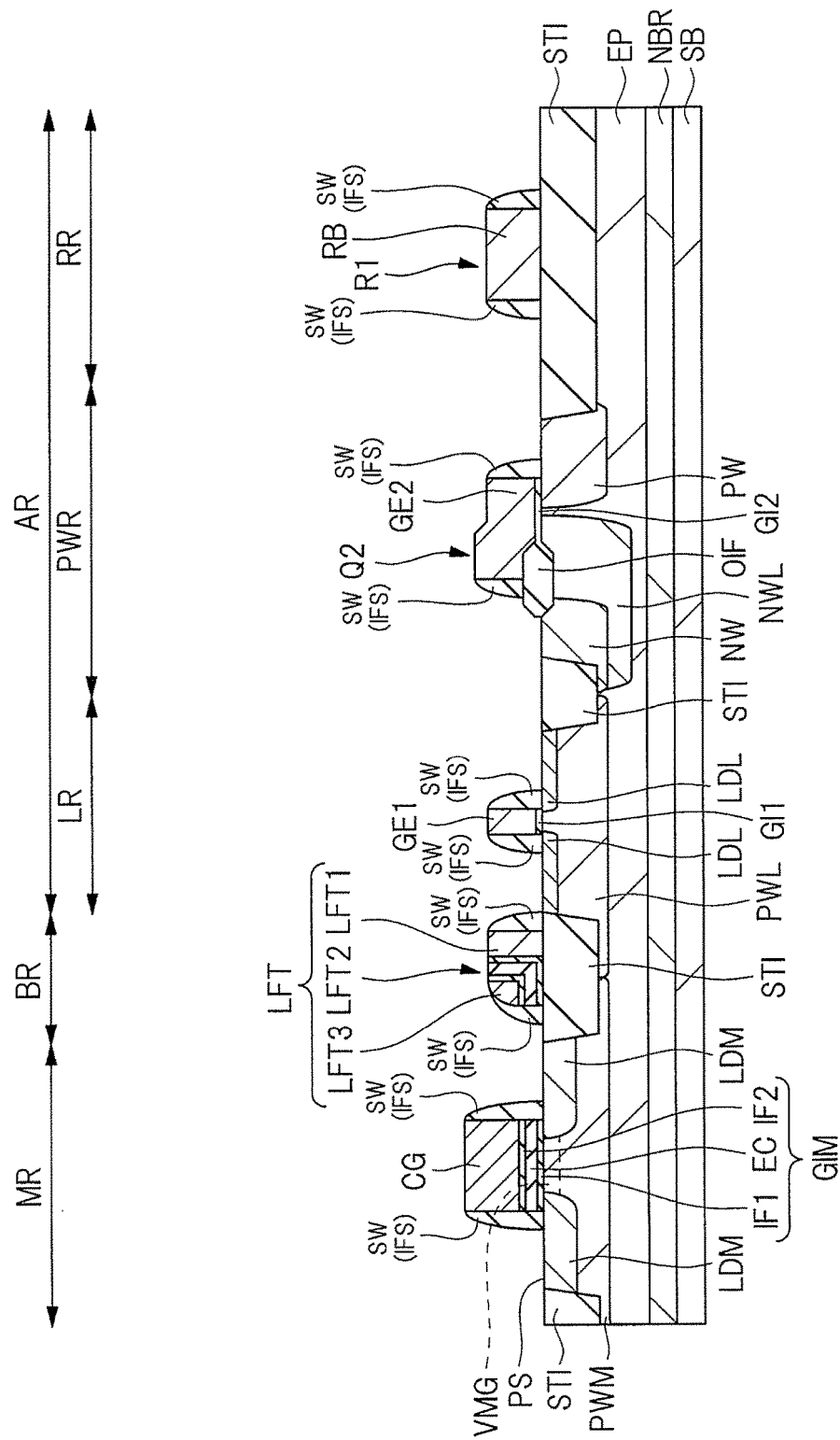
FIG. 19 is a cross-sectional view of a principal part in the middle of the process of manufacturing the semiconductor device according to the embodiment.

Next, the sidewall spacer SW is formed as illustrated in FIG. 19 (Step S15 in FIG. 6).

In this Step S15, first, the insulating film IFS for the sidewall spacer is formed on the entire upper surface PS of the semiconductor substrate SB. The insulating film IFS is formed of, for example, an insulating film made of silicon oxide, an insulating film made of silicon nitride, or a stacked film of them.

Next, the insulating film IFS is etched back by, for example, anisotropic etching. In this manner, the insulating film IFS is selectively left on both the side surfaces of the gate electrode CG in the memory formation region MR, and accordingly, the sidewall spacer SW, formed of the insulating film IFS, is formed on each of the both the side surfaces of the gate electrode CG. Note that the sidewall spacer SW is formed also on both side surfaces of the gate insulating film GIM.

In addition, the insulating film IFS is selectively left on both the side surfaces of the gate electrode GE1 in the low-breakdown-voltage MISFET formation region LR, and accordingly, the sidewall spacer SW, formed of the insulating film IFS, is formed on each of both the side surfaces of the gate electrode GE1. Note that the respective sidewall spacers SW are formed also on the respective side surfaces of the gate insulating film GI1.

In addition, the insulating film IFS is selectively left on both the side surfaces of the gate electrode GE2 in the power transistor formation region PWR, and accordingly, the sidewall spacer SW, formed of the insulating film IFS, is formed on each of both the side surfaces of the gate electrode GE2. Note that each of the sidewall spacers SW is formed also on each of the side surfaces of the gate insulating film GI1.

Further, the insulating film IFS is selectively left on both the side surfaces of the resistor body RB in the resistance element formation region RR, and accordingly, the sidewall spacer SW, formed of the insulating film IFS, is formed each of both the side surfaces of the resistor body RB. Note that the sidewall spacer SW, formed of the insulating film IFS, is formed also on the side surfaces of the residual pattern LFT.

Figure 20:
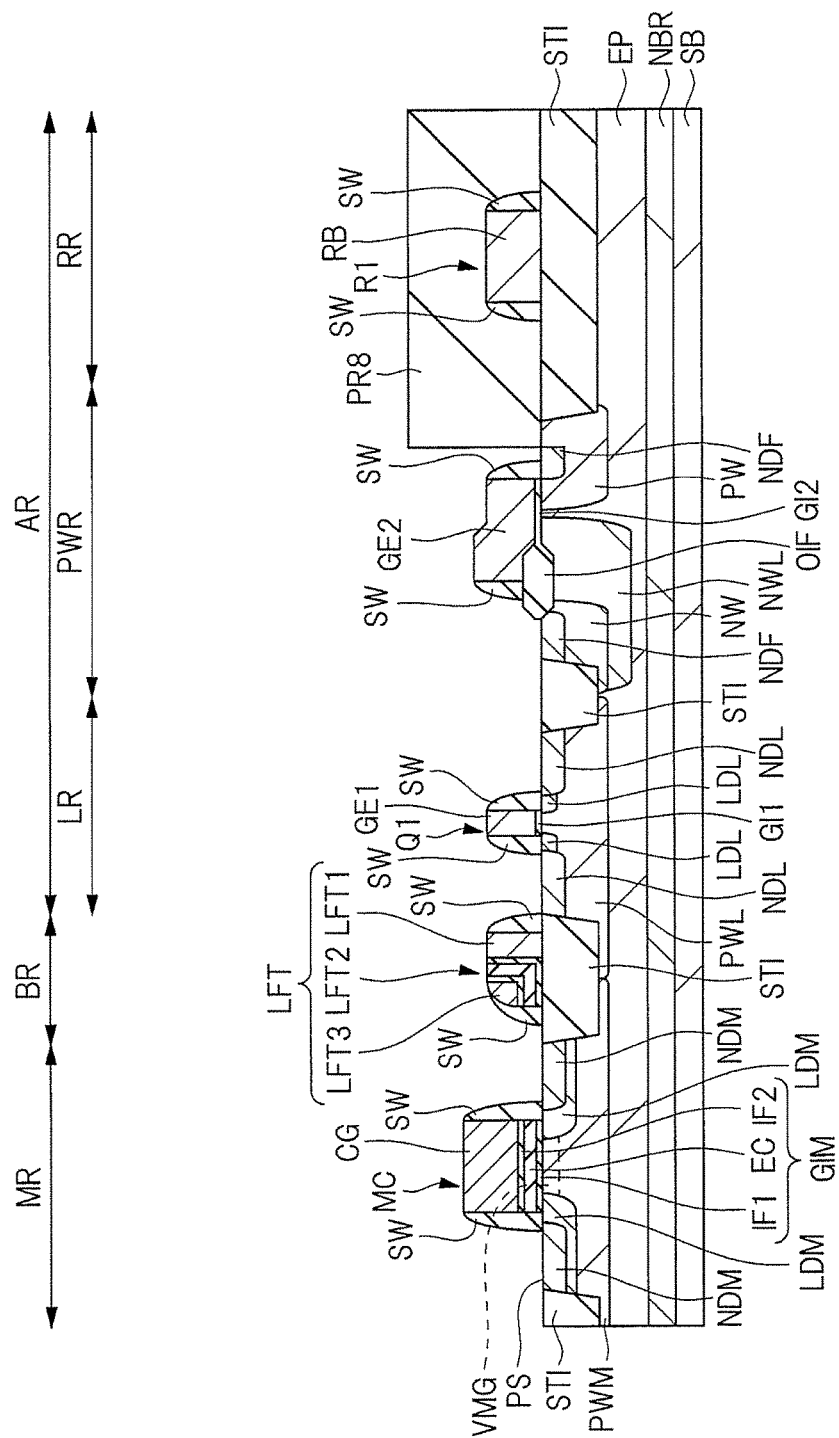
FIG. 20 is a cross-sectional view of a principal part in the middle of the process of manufacturing the semiconductor device according to the embodiment.

Next, the $n^+$-type semiconductor regions NDM, NDL and NDF are formed as illustrated in FIG. 20 (Step S16 in FIG. 6).

In this Step S16, first, a resist film PR8 is applied onto the upper surface PS of the semiconductor substrate SB, and the applied resist film PR8 is patterned by using the photolithography technique. The resist film PR8 is patterned so that the upper surface PS of the semiconductor substrate SB is covered by the resist film PR8 in the resistance element formation region RR, and so that the upper surface PS of the semiconductor substrate SB is exposed from the resist film PR8 in the memory formation region MR, the low-breakdown-voltage MISFET formation region LR, and the power transistor formation region PWR.

Next, the n-type impurity such as arsenic (As) or phosphorus (P) is introduced into the semiconductor substrate SB by the ion implantation method using the patterned resist film PR8 as a mask. At this time, the n-type impurity ion is implanted into the semiconductor substrate SB by using the gate electrodes CG, GE1 and GE2 and the sidewall spacer SW as a mask in the memory formation region MR, the low-breakdown-voltage MISFET formation region LR, and the power transistor formation region PWR.

In this manner, in the memory formation region MR, the $n^+$-type semiconductor region NDM is formed in the upper layer portion of the p-type well PWM of a portion positioned on the opposite side to the gate electrode CG across the sidewall spacer SW when seen in a plan view. In addition, in the low-breakdown-voltage MISFET formation region LR, the $n^+$-type semiconductor region NDL is formed in the upper layer portion of the p-type well PWL of a portion positioned on the opposite side to the gate electrode GE1 across the sidewall spacer SW when seen in a plan view. Further, in the power transistor formation region PWR, the $n^+$-type semiconductor region NDF is formed in the upper layer portion of the n-type well NW of a portion positioned on the opposite side to the gate electrode GE2 across the sidewall spacer SW when seen in a plan view. In addition, in the power transistor formation region PWR, the $n^+$-type semiconductor region NDF is formed in the upper layer portion of the p-type well PW of a portion positioned on the opposite side to the gate electrode GE2 across the sidewall spacer SW when seen in a plan view.

In the memory formation region MR, the $n^+$-type semiconductor region NDM is formed to be aligned with the sidewall spacer SW. In addition, the $n^+$-type semiconductor region NDL is formed to be aligned with the sidewall spacer SW in the low-breakdown-voltage MISFET formation region LR, and the $n^+$-type semiconductor region NDF is formed to be aligned with the sidewall spacer SW in the power transistor formation region PWR. An n-type impurity concentration of the $n^+$-type semiconductor region NDM is higher than an n-type impurity concentration of the $n^-$-type semiconductor region LDM. An n-type impurity concentration of the $n^+$-type semiconductor region NDL is higher than an n-type impurity concentration of the $n^-$-type semiconductor region LDL. An n-type impurity concentration of the $n^+$-type semiconductor region NDF is higher than an n-type impurity concentration of the n-type well NW.

In this manner, in the memory formation region MR, the MONOS transistor MC is formed of the p-type well PWM, the gate insulating film GIM, the gate electrode CG, the sidewall spacer SW, the $n^-$-type semiconductor region LDM, and the $n^+$-type semiconductor region NDM as illustrated in FIG. 20. In addition, the memory cell serving as the non-volatile memory is formed of the MONOS transistor MC.

Meanwhile, in the low-breakdown-voltage MISFET formation region LR, the low-breakdown-voltage MISFET Q1 is formed of the p-type well PWL, the gate insulating film GI1, the gate electrode GE1, the sidewall spacer SW, the $n^-$-type semiconductor region LDL, and the $n^+$-type semiconductor region NDL as illustrated in FIG. 20.

In this manner, in the present embodiment, the $n^+$-type semiconductor region NDM of the MONOS transistor MC, the $n^+$-type semiconductor region NDL of the low-breakdown-voltage MISFET Q1, the $n^+$-type semiconductor region NDF of the power transistor Q2 are formed together. Accordingly, an additional mask is unnecessary to newly form the $n^+$-type semiconductor region NDM of the MONOS transistor. Accordingly, according to the present embodiment, it is possible to reduce the additional mask required at the time of mixedly mounting the MONOS transistor.

Then, the patterned resist film PR8 is removed by, for example, ashing.

Figure 21:
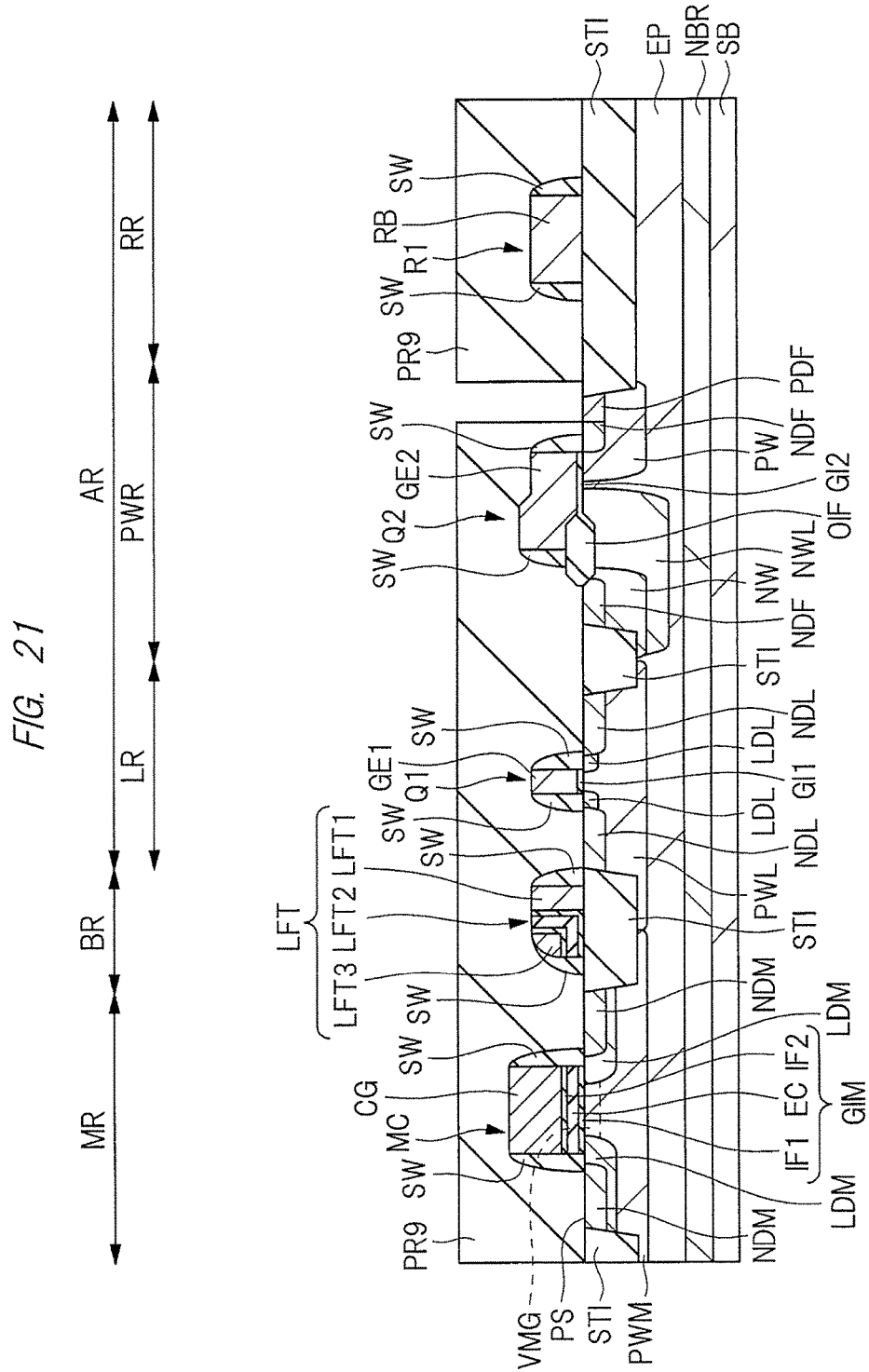
FIG. 21 is a cross-sectional view of a principal part in the middle of the process of manufacturing the semiconductor device according to the embodiment.

Next, the $p^+$-type semiconductor region PDF is formed as illustrated in FIG. 21 (Step S17 in FIG. 6).

In this Step S17, first, a resist film PR9 is applied onto the upper surface PS of the semiconductor substrate SB, and the applied resist film PR9 is patterned by using the photolithography technique. The resist film PR9 is patterned so that the upper surface PS of the semiconductor substrate SB is covered by the resist film PR9 in the resistance element formation region RR, and so that the upper surface PS of the semiconductor substrate SB is exposed from the resist film PR9 in the memory formation region MR and the low-breakdown-voltage MISFET formation region LR. In addition, the resist film PR9 is patterned so that the upper surface PS of the semiconductor substrate SB is exposed from the resist film PR9 in a region of the power transistor formation region PWR in which the $p^+$-type semiconductor region PDF is formed, and so that the upper surface PS of the semiconductor substrate SB is covered by the resist film PR9 in a region other than the region in which the $p^+$-type semiconductor region PDF is formed.

Next, the p-type impurity such as boron (B) or others is introduced into the semiconductor substrate SB by the ion implantation method using the patterned resist film PR9 as a mask. At this time, in the power transistor formation region PWR, the p-type impurity ion is implanted into the semiconductor substrate SB using the patterned resist film PR9 as a mask.

In this manner, in the power transistor formation region PWR, the $p^+$-type semiconductor region PDF is formed in a portion of the upper layer portion of the p-type well PW, the portion being adjacent to the $n^+$-type semiconductor region NDF. Further, in the power transistor formation region PWR, the n-channel power transistor Q2 is formed of the n-type well NWL, the n-type well NW, the p-type well PW, the gate insulating film GI2, the gate electrode GE2, the sidewall spacer SW, the n$^+$-type semiconductor region NDF, and the p$^+$-type semiconductor region PDF. The n$^+$-type semiconductor region NDF to be formed in the upper layer portion of the n-type well NW is a drain region of the power transistor Q2. In addition, the p-type well PW is a body region of the power transistor Q2, the n$^+$-type semiconductor region NDF to be formed in the upper layer portion of the p-type well PW is a source region of the power transistor Q2, and the p$^+$-type semiconductor region PDF to be formed in the upper layer portion of the p-type well PW is a body contact region.

Here, heat treatment is performed at high temperature of about 1000 to 1050° C. in order to activate the n-type impurities and the p-type impurities which have been introduced by the ion implantation in FIGS. 19 to 21. It is necessary to perform the heat treatment in the time for maintaining the high temperature for a short period of time equal to or shorter than one second in order to prevent excessive diffusion of the impurities, which results in deterioration in short-channel characteristic of the transistor. The heat treatment is performed after the ion implantation illustrated in FIGS. 19 and 20 in order to recover the damage caused by the ion implantation. However, it is necessary to perform the heat treatment of the time for maintaining high temperature for a short period of time equal to or shorter than one second when being performed at high temperature of about 1000 to 1050° C., and it is necessary to set low temperature at 850 to 950° C. when the time for maintaining high temperature is set to ten minutes to one hour.

At this time, for example, the process of forming the n$^+$-type semiconductor regions NDL and NDF includes the process of ion-implanting the n-type impurities, and the subsequent process of activating the ion-implanted impurities by the heat treatment of the semiconductor substrate SB. In addition, a heat treatment temperature in the process of forming the insulating film IFG (see FIG. 13) is higher than a heat treatment temperature in the process of forming the n$^+$-type semiconductor regions NDL and NDF. In addition, a heat treatment time in the process of forming the insulating film IFG (see FIG. 13) is longer than a heat treatment time in the process of forming the n$^+$-type semiconductor regions NDL and NDF.

Figure 22:
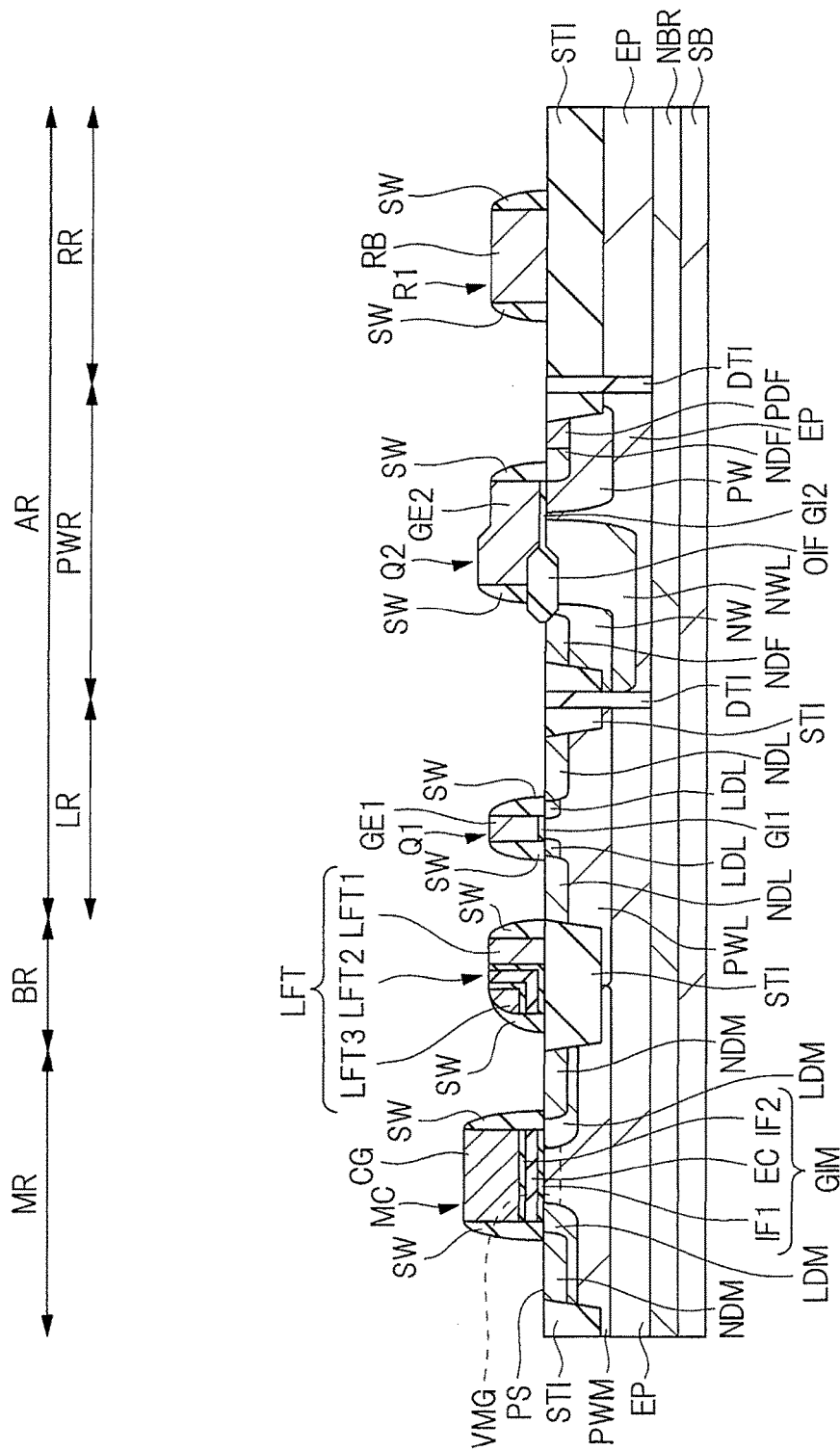
FIG. 22 is a cross-sectional view of a principal part in the middle of the process of manufacturing the semiconductor device according to the embodiment.

Next, the deep trench isolation region DTI is formed as illustrated in FIG. 22 (Step S18 in FIG. 6). In this Step S18, the deep trench isolation region DTI, which passes through the p$^-$-type epitaxial layer EP and reaches the n-type buried region NBR, is formed in the element isolation region STI to partition the power transistor formation region PWR.

Next, the interlayer insulating film IL1 and the plug PG are formed as illustrated in FIG. 3 (Step S19 in FIG. 6).

In this Step S19, first, the interlayer insulating film IL1 is formed on the entire upper surface PS of the semiconductor substrate SB so as to cover the MONOS transistor MC, the low-breakdown-voltage MISFET Q1, the power transistor Q2, and the resistor body RB. The interlayer insulating film IL1 is formed of, for example, an insulating film made of silicon oxide or a stacked film including an insulating film made of silicon nitride and an insulating film made of silicon oxide. The interlayer insulating film IL1 is formed by, for example, the CVD method, and then, the upper surface of the interlayer insulating film IL1 is flattened.

Next, in this Step S19, the plug PG that passes through the interlayer insulating film IL1 is formed. First, the contact hole CNT is formed in the interlayer insulating film IL1 by dry-etching the interlayer insulating film IL1 by using photolithography in which a resist pattern (not illustrated) formed on the interlayer insulating film IL1 is used as an etching mask. Next, inside the contact hole CNT, the conductive plug PG made of tungsten (W) or others is formed as, for example, a conductor portion.

In order to form the plug PG, the barrier conductor film, made of, for example, the titanium (Ti) film, the titanium nitride (TiN) film or the stacked film of them, is formed on, for example, the interlayer insulating film IL1 including an inner portion of the contact hole CNT. Then, the main conductor film, made of, for example, the tungsten (W) film or others, is formed on the barrier conductor film so as to bury the contact hole CNT, and the unnecessary main conductor film and barrier conductor film on the interlayer insulating film IL1 are removed by the CMP method, the etch-back method or others. Accordingly, the plug PG can be formed. Note that FIG. 3 integrally illustrates the barrier conductor film and the main conductor film, which configure the plug PG for simplification of the drawing.

The contact hole CNT and the plug PG, buried in the contact hole CNT, are formed on each of the n$^+$-type semiconductor regions NDM, NDL and NDF, and the pt-type semiconductor region PDF, and are formed also on each of the gate electrodes CG, GE1 and GE2, and the resistor body RB although not illustrated.

Next, the interlayer insulating film IL2 and the wiring ML1 are formed as illustrated in FIG. 3 (Step S20 in FIG. 6).

In this Step S20, first, the interlayer insulating film IL2, which is made of, for example, silicon oxide, is formed on the interlayer insulating film IL1 in which the plug PG is formed as illustrated in FIG. 3. Further, the wiring trench is formed in the interlayer insulating film IL2 by using the photolithography technique and the etching technique. Then, a copper (Cu) film is formed on the interlayer insulating film IL2 including the inner portion of the wiring trench. Then, the copper film exposed from the interlayer insulating film IL2 except for the inner portion of the wiring trench, is polished and removed by, for example, the CMP method, so that the copper film can be left only inside the wiring trench formed in the interlayer insulating film IL2. Accordingly, the wiring ML1 can be formed. In this manner, it is possible to form the semiconductor chip CHP as the semiconductor device of the present embodiment.

In the present embodiment, note that the explanation has been made about the example in which the film CF1 is integrally formed between the resistance element formation region RR, and the low-breakdown-voltage MISFET formation region LR and the power transistor formation region PWR. However, the film CF1 may be integrally not formed between the resistance element formation region RR, and the low-breakdown-voltage MISFET formation region LR and the power transistor formation region PWR. Accordingly, in the low-breakdown-voltage MISFET formation region LR and the power transistor formation region PWR, a film corresponding to the film CF1 may be formed by a process different from a process of forming the film CF1 in the resistance element formation region RR.

However, in the integral formation of the film CF1 between the resistance element formation region RR, and the low-breakdown-voltage MISFET formation region LR and the power transistor formation region PWR, the number of steps in the process of manufacturing the semiconductor device can be smaller than the no integral formation of the film CF1.

In addition, in the present embodiment, the example in which the wiring ML1 formed of the copper film has been described. However, the wiring ML1 may be formed of, for example, an aluminum (Al) film.

<Mismatch Characteristic of Resistance Element>

Next, the mismatch characteristic of the resistance element will be described while comparing the semiconductor devices according to a first comparative example and a second comparative example. Here, a method of manufacturing the semiconductor device according to the first comparative example is the same as the method of manufacturing the semiconductor device according to the embodiment except that the process of implanting the impurity ion IM2 is not performed. In addition, the semiconductor device according to the second comparative example is different from all of the semiconductor device according to the first comparative example and the semiconductor device according to the embodiment in that the non-volatile memory, that is, the memory formation region MR (see FIG. 3) is not provided. That is, in the semiconductor device according to the second comparative example, the add-on circuit is not configured of the non-volatile memory.

Figure 23:
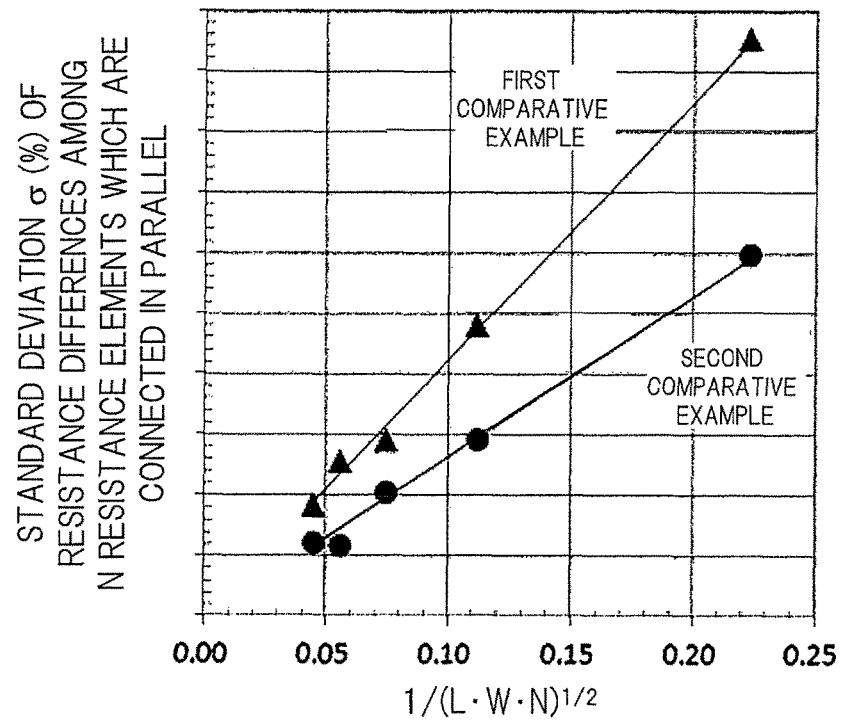
FIG. 23 is a graph illustrating a mismatch characteristic of a resistance element in semiconductor devices according to a first comparative example and a second comparative example.

FIG. 23 is a graph illustrating a mismatch characteristic of a resistance element in the semiconductor devices according to the first comparative example and the second comparative example. The vertical axis of FIG. 23 is a standard deviation a of resistance differences among N resistance elements which are connected in parallel. The resistance difference indicated by the vertical axis of FIG. 23 is a value obtained by normalizing a resistance difference AR by a certain resistance value R and representing the normalized value by percentage. On the other hand, the horizontal axis of FIG. 23 is represented as an inverse of a square root of sum of areas of the N resistance elements R1. On an assumption that a length and a width of the resistor body RB of the resistance element R1 are set to L (μm) and W (μm), respectively, when seen in a plan view, the inverse of the square root of the sum of areas of the N resistance elements R1 is represented by "$1/(L \cdot W \cdot N)^{1/2}$". Note that the resistance differences among the N resistance elements R1 connected in parallel are referred to as the mismatch characteristic, and a plot as illustrated in FIG. 23 is referred to as a Pelgrom plot.

Figure 24:
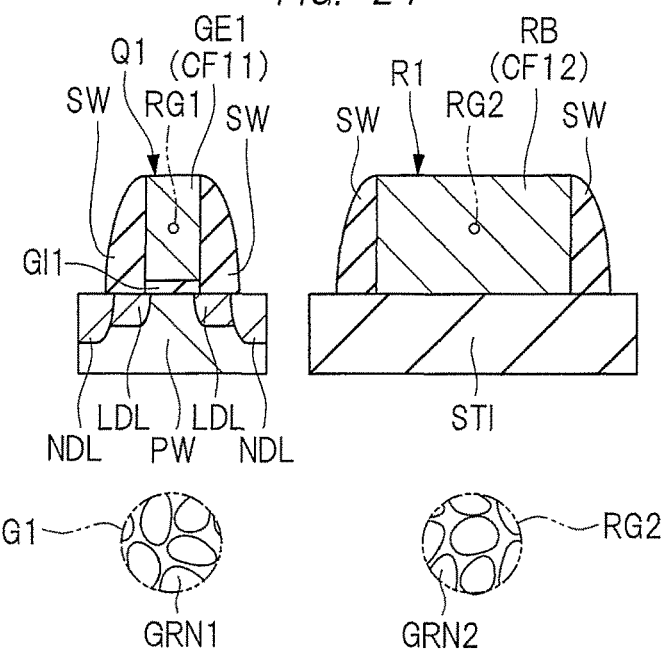
FIG. 24 is a cross-sectional view illustrating a periphery of a MONOS transistor and the resistance element according to the first comparative example in an enlarged manner.
Figure 25:
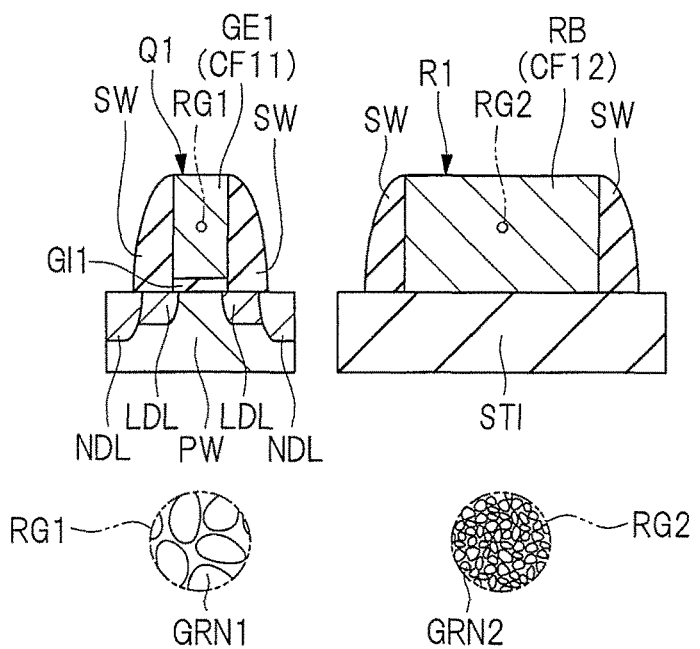
FIG. 25 is a cross-sectional view illustrating a periphery of a MONOS transistor and a resistance element according to the embodiment in an enlarged manner.

FIG. 24 is a cross-sectional view illustrating a periphery of a MONOS transistor and the resistance element according to the first comparative example to be enlarged. FIG. 25 is a cross-sectional view illustrating a periphery of the MONOS transistor and the resistance element according to the embodiment to be enlarged. FIGS. 24 and 25 illustrate regions RG1 and RG2 each of which is surrounded by two-dot chain lines to be enlarged.

As illustrated in FIG. 23, a resistance variation of the resistance element R1 is larger in the first comparative example than the second comparative example, and therefore, the mismatch characteristic deteriorates. It is considered that this is because the crystal grains of the film portion CF12, made of polycrystalline silicon included in the resistor body RB of the resistance element R1, grow and their particle sizes increase more by the addition of the heat treatment at the time of forming the non-volatile memory in the first comparative example than the second comparative example.

A maximum temperature of the heat treatment temperature in the process of manufacturing the semiconductor device is higher in the first comparative example than the second comparative example. When the maximum temperature of the heat treatment temperature in the process of manufacturing the semiconductor device high, the growth of the crystal grains of the polycrystalline silicon film is promoted. That is, the heat treatment temperature affects the growth of the crystal grains of the polycrystalline silicon film.

As described above, the heat treatment temperature in the process of forming the insulating film IFG is higher than the heat treatment temperature in the process of forming the $n^+$-type semiconductor regions NDL and NDF. Accordingly, from a viewpoint of the heat treatment temperature, the influence of the heat treatment in the process of forming the insulating film IFG on the growth of the crystal grains of the polycrystalline silicon film is larger than the influence of the heat treatment in the process of forming the $n^+$-type semiconductor regions NDL and NDF, that is, the source region and the drain region of the transistor on the growth of the crystal grains of the polycrystalline silicon film.

Particularly, the heat treatment is performed, for example, at high temperature of about 1150° C. for about two hours in the formations of the insulating film IF1, the charge storage film EC, and the insulating film IF2 for the gate insulating film of the MONOS transistor MC, and thus, the growth of the crystal grains of the polycrystalline silicon film included in the resistor body RB of the resistance element R1 is promoted. As illustrated in FIG. 24, in the first comparative example, a particle size of a crystal grain GRN2 of polycrystalline silicon in the film portion CF12 included in the resistor body RB of the resistance element R1 is as large as a particle size of a crystal grain GRN1 of polycrystalline silicon in the conductive film CF11 included in the gate electrode GE1 of the low-breakdown-voltage MISFET Q1.

Meanwhile, the growth of the crystal grains of the polycrystalline silicon film is promoted when the heat treatment time in the process of manufacturing the semiconductor device is long. That is, the heat treatment time affects the growth of the crystal grains of the polycrystalline silicon film. In addition, as described above, the heat treatment time in the process of forming the insulating film IFG is longer than the heat treatment time in the process of forming the $n^+$-type semiconductor regions NDL and NDF. Accordingly, also from a viewpoint of the heat treatment time, the influence of the heat treatment in the process of forming the insulating film IFG on the growth of the crystal grains of the polycrystalline silicon film is larger than the influence of the heat treatment in the process of forming the $n^+$-type semiconductor regions NDL and NDF, that is, the source region and the drain region of the transistor on the growth of the crystal grains of the polycrystalline silicon film.

When the growth of the crystal grain GRN2 of the film portion CF12, made of the polycrystalline silicon, included in the resistor body RB of the resistance element R1 is promoted, the variation of the resistance differences among the N resistance elements R1, that is, the deterioration of the so-called mismatch characteristic of the resistance cannot be prevented or suppressed in each set formed of the N (N is plural) resistance elements R1 connected in parallel. Accordingly, a performance of the semiconductor device decreases.

Alternatively, in order to prevent or suppress the deterioration of the mismatch characteristic of resistance, it is also considered to increase the length L and the width W of the resistor body RB. However, when the length L and the width W of the resistor body RB increase, the semiconductor device cannot be easily downsized or integrated.

Meanwhile, in the present embodiment, the process of implanting the impurity ion IM2 into the film CF1 is performed before forming the insulating film IFG. The growth of the crystal grains is suppressed in the film portion CF12, formed of the film CF1, into which the impurity IM21 is implanted, more than the film CF1 into which the impurity IM21 is not implanted, for example, than the conductive film CF11. Thus, it is possible to prevent or suppress the variation of the resistance differences among the N resistance elements R1 in each set formed of the N (N is plural) resistance elements R1 connected in parallel, and it is possible to prevent or suppress the deterioration of the so-called mismatch characteristic of resistance, so that it is possible to improve the performance of the semiconductor device.

As illustrated in FIG. 25, in the present embodiment, the particle size of the crystal grain GRN2 of the polycrystalline silicon in the film portion CF12 included in the resistor body RB of the resistance element R1 is smaller than the particle size of the crystal grain GRN1 of the polycrystalline silicon in the conductive film CF11 included in the gate electrode GE1 of the low-breakdown-voltage MISFET Q1.

The impurity ion IM2 is different from the impurity which is ion-implanted in order to provide the conductivity to the polycrystalline silicon film, that is, the n-type impurity such as phosphorus (P) or arsenic (As) or the p-type impurity such as boron (B). As described above, as the impurity configured to suppress the growth of the crystal grains, it is possible to use at least one type of elements which is selected from the group including the group 14 element, nitrogen (N), and the group 18 element.

As described above, the heat treatment temperature in the process of forming the insulating film IFG is higher than the heat treatment temperature in the process of forming the $n^+$-type semiconductor region NDL. In addition, the heat treatment time in the process of forming the insulating film IFG is longer than the heat treatment time in the process of forming the $n^+$-type semiconductor regions NDL and NDF. Thus, in the method of manufacturing the semiconductor device, that is, in the method of manufacturing the semiconductor device including the MONOS transistor MC, the effect to suppress the growth of the crystal grains of the polycrystalline silicon is larger than in the method of manufacturing the semiconductor device not including the MONOS transistor MC.

In addition, in the present embodiment, it is not necessary to increase the length L and the width W of the resistor body RB of the resistance element R1 in order to prevent or suppress the deterioration of the mismatch characteristic of resistance. Thus, when the length L and the width W of the resistance element R1 is increased, the semiconductor device can be easily downsized or integrated.

<Resistor Body Formed on Same Layer as Gate Electrode of Low-Breakdown-Voltage MISFET>

Next, explanation will be made about an advantage obtained when the resistor body of the resistance element R1 is formed on the same layer as the gate electrode GE1 of the low-breakdown-voltage MISFET Q1 while being compared with a semiconductor device according to a third comparative example. The semiconductor device according to the third comparative example is different from the semiconductor device of the embodiment in that a resistor body RB100 of a resistance element R101 formed in the resistance element formation region RR is not formed on the same layer as the gate electrode GE1 formed in the low-breakdown-voltage MISFET formation region LR, but is formed on the same layer as the gate electrode CG formed in the memory formation region MR.

Figure 26:
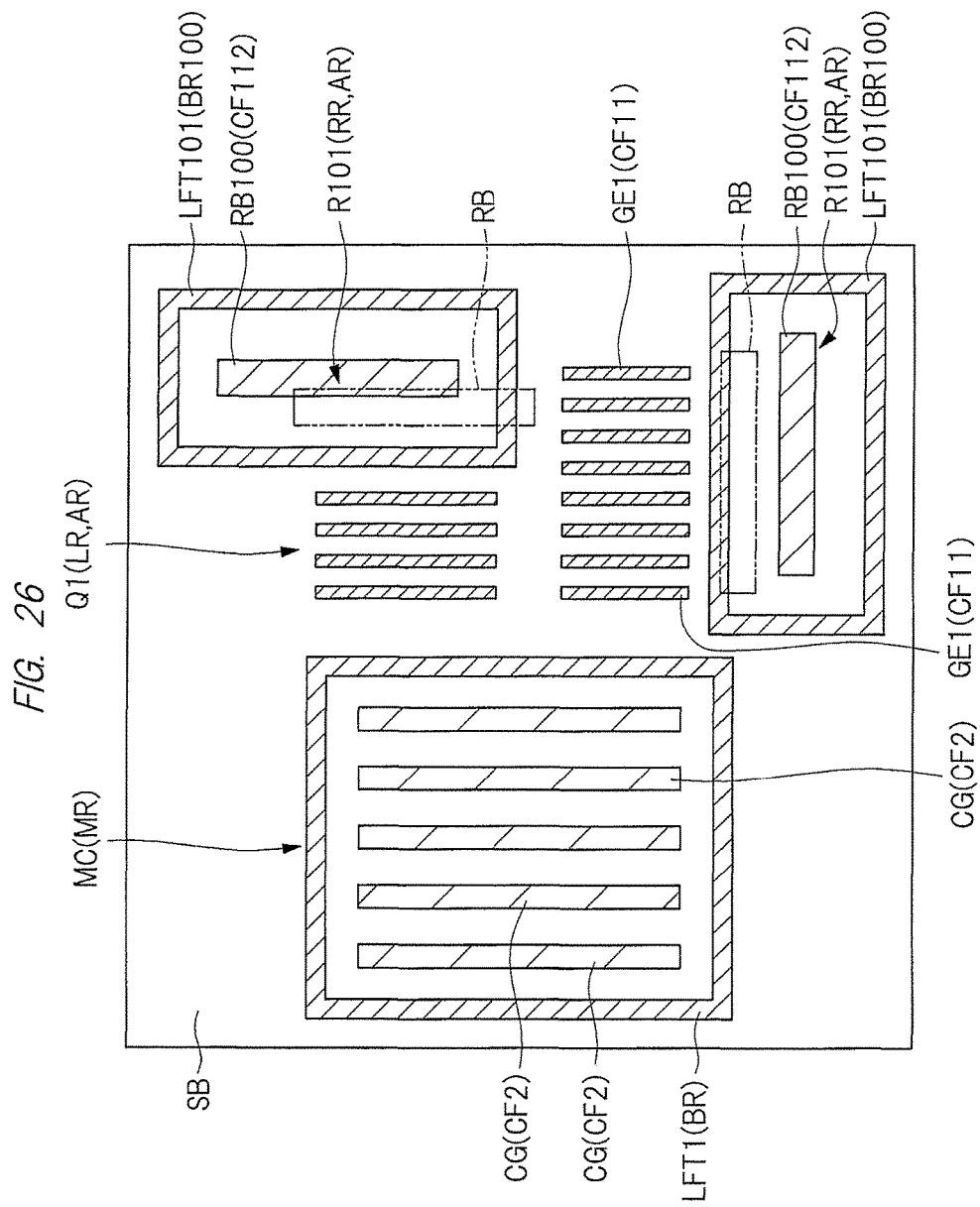
FIG. 26 is a plan view of a principal part of a semiconductor device according to a third comparative example.
Figure 27:
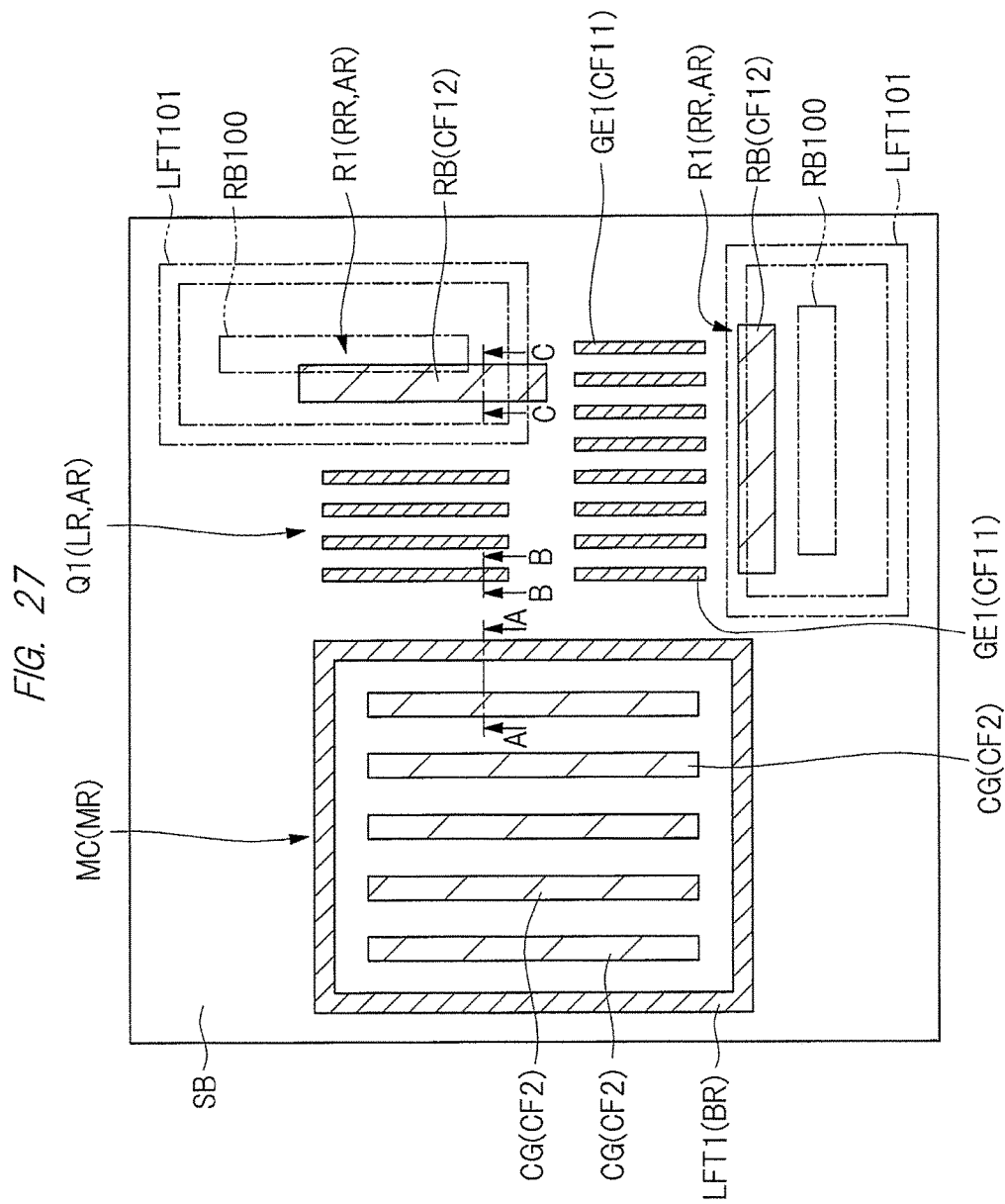
FIG. 27 is plan view of a principal part of the semiconductor device according to the embodiment.

FIG. 26 is a plan view of a principal part of the semiconductor device according to the third comparative example. FIG. 27 is a plan view of a principal part of the semiconductor device according to the embodiment. Note that cross-sectional views taken along a line A-A, a line B-B, and a line C-C of FIG. 27 correspond to cross-sectional views of the memory formation region MR, the low-breakdown-voltage MISFET formation region LR and the resistance element formation region RR of FIG. 3, respectively. In FIGS. 26 and 27, note that the illustration of the residual portions LFT2 and LFT3 of the residual pattern LFT and the element isolation region STI (see FIG. 3) is omitted. In addition, the resistor body RB according to the embodiment is illustrated by a two-dot chain line in FIG. 26, and the resistor body RB100 and a residual portion LFT101 according to the third comparative example are illustrated by two-dot chain lines in FIG. 27.

As illustrated in FIGS. 26 and 27, the boundary region BR is provided to surround the memory formation region MR in both the semiconductor device of the third comparative example and the semiconductor device of the embodiment, and the residual portion LFT1 is formed in the boundary region BR. That is, the residual portion LFT1 is formed to surround the MONOS transistor MC.

This is because the process of forming the conductive film CF2 included in the gate electrode CG, which is formed inside the memory formation region MR, is performed after, for example, the process of forming the conductive film CF11 included in the gate electrode GE1 which is formed outside the memory formation region MR (MONOS-LAST).

As described above with reference to FIGS. 7 to 22, in the manufacturing method which is called MONOS-LAST, the insulating film for the well and the gate insulating film of the MONOS transistor MC is formed in the memory formation region MR after forming the conductive film for the well and the gate electrode of the low-breakdown-voltage MISFET Q1, the power transistor Q2 and others in the main circuit formation region AR. Accordingly, it is possible to suppress the excessive application of the thermal load to the MONOS transistor MC at the time of forming the conductive film for the well or the gate electrode in the main circuit formation region AR.

Meanwhile, in the semiconductor device of the third comparative example, a boundary region BR100 is provided so as to surround the resistance element formation region RR as different from the embodiment, and the residual portion LFT101 is formed in the boundary region BR100. That is, the residual portion LFT101 is formed so as to surround the resistor body RB100 of the resistance element R101.

This is because, in the third comparative example, a film portion CF112, which is made of polycrystalline silicon and included in the resistor body RB100 of the resistance element R101, is formed on the same layer as the conductive film CF2 included in the gate electrode CG of the MONOS transistor MC as different from the embodiment. That is, this is because, in the third comparative example, a process of forming the film portion CF112, which is included in the resistor body RB100 of the resistance element R101 formed inside the resistance element formation region RR, is performed after the process of forming, for example, the conductive film CF11 included in the gate electrode GE1 of the low-breakdown-voltage MISFET Q1 which is formed outside the resistance element formation region RR.

Since the residual portion LFT101 is formed so as to surround the resistance element R101 in the semiconductor device of the third comparative example, the area where the residual portion LFT101 is arranged in periphery of the resistance element R101 is increased. Thus, the semiconductor device of the third comparative example cannot be easily downsized or integrated.

On the other hand, as illustrated in FIG. 27, the resistor body RB is formed on the same layer as the gate electrode GE1 of the low-breakdown-voltage MISFET Q1 in the semiconductor device of the embodiment, and therefore, the residual portion is not formed in the periphery of the resistance element R1 as different from the semiconductor device of the third comparative example. Thus, the increase in the area where the residual portion is arranged in the periphery of the resistance element R1 can be more prevented in the semiconductor device of the embodiment than the semiconductor device of the third comparative example. Accordingly, by performing the manufacturing method which is called MONOS-LAST, the semiconductor device of the embodiment can be easily downsized or integrated while suppressing the excessive application of the thermal load to the MONOS transistor.

Although not illustrated in FIG. 27, note that an advantage in which the resistor body RB is formed on the same layer as the gate electrode GE2 of the power transistor Q2 is also the same as the advantage in which the resistor body RB is formed on the same layer as the gate electrode GE1 of the low-breakdown-voltage MISFET Q1.

In the foregoing, the invention made by the present inventors has been concretely described based on the embodiments. However, it is needless to say that the present invention is not limited to the foregoing embodiments and various modifications and alterations can be made within the scope of the present invention.

What is claimed is:

1. A method of manufacturing a semiconductor device comprising steps of:
    (a) providing a semiconductor substrate;
    (b) forming a first resistor element comprised of polycrystalline silicon in a first region of a main surface of the semiconductor substrate;
    (c) ion-implanting a first impurity, which is at least one selected from a group consisting of: a group 14 element, nitrogen, and a group 18 element, into the first resistor element; and
    (d) after the step (c), forming an insulating film including a charge storage portion in a second region of the main surface of the semiconductor substrate; which is different from the first region;
    (e) ion-implanting a second impurity into a third region of the main surface of the semiconductor substrate, which is different from the first and second regions; and
    (f) after the step (e), performing a first heat treatment on the semiconductor substrate so as to activate the second impurity,
    wherein, during the step (d), or after the step (d) and before the step (e), a second heat treatment is performed on the semiconductor substrate so as to improve a quality of the insulating film, and
    wherein the second heat treatment has a longer duration than the first heat treatment.

2. The method of manufacturing the semiconductor device according to claim 1, wherein the first impurity is at least one of carbon, silicon, germanium, nitrogen, argon, helium, or xenon.

3. The method of manufacturing the semiconductor device according to claim 1, further comprising a step of:
    ion-implanting a second impurity of p-type into the first resistor element.

4. The method of manufacturing the semiconductor device according to claim 3, wherein the step of ion-implanting the second impurity is after the step of ion-implanting the first impurity.

5. The method of manufacturing the semiconductor device according to claim 3, wherein the second impurity is boron.

6. The method of manufacturing the semiconductor device according to claim 1, wherein the insulating film includes a silicon oxide film formed over the charge storage portion and a silicon oxide film formed below the charge storage portion.

7. The method of manufacturing the semiconductor device according to claim 1, wherein the charge storage portion is a silicon nitride film.

8. The method of manufacturing the semiconductor device according to claim 1, wherein the heat treatment improves the reliability of a memory element by improving the quality of the insulating film.

9. The method of manufacturing the semiconductor device according to claim 1, further comprising a step of:
    (g) forming a source region and a drain region of a transistor,
    wherein the heat treatment temperature in step (d) is higher than a heat treatment temperature in step (g).

10. The method of manufacturing the semiconductor device according to claim 1,
    wherein, in the step (b), a second resistor element comprised of polycrystalline silicon is formed in a fourth region of the main surface of the semiconductor substrate, which is different from the first, second and third regions, and
    wherein, in the step (c), the first impurity is implanted into each of the first resistor element and the second resistor element.

11. The method of manufacturing the semiconductor device according to claim 10,
    wherein a temperature of each of the first heat treatment and the second heat treatment is within a range of approximately 1050° C. to approximately 1150° C.

12. The method of manufacturing the semiconductor device according to claim 10,
    wherein the second heat treatment has a duration within a range of approximately ten minutes to approximately two hours.

* * * * *